United States Patent

Morita et al.

[11] Patent Number: 6,152,669
[45] Date of Patent: Nov. 28, 2000

[54] MECHANICAL INTERFACE APPARATUS

[75] Inventors: Teruya Morita; Masanao Murata; Hitoshi Kawano; Tsuyoshi Tanaka; Hiroyuki Oyobe; Toshiyuki Takaoka, all of Ise, Japan

[73] Assignee: Shinko Electric Co., Ltd., Tokyo, Japan

[21] Appl. No.: 08/747,113

[22] Filed: Nov. 8, 1996

[30] Foreign Application Priority Data

Nov. 13, 1995 [JP] Japan .................................. 7-294147

[51] Int. Cl.[7] .................................................. B65G 49/07
[52] U.S. Cl. ........................... 414/217; 414/939; 414/940
[58] Field of Search .................................. 414/940, 939, 414/935, 217, 416, 292

[56] References Cited

U.S. PATENT DOCUMENTS

| 5,169,272 | 12/1992 | Bonora et al. | 414/217 |
| 5,433,574 | 7/1995 | Kawano et al. | 414/940 |
| 5,575,081 | 11/1996 | Ludwig | 414/940 |
| 5,586,585 | 12/1996 | Bonora et al. | 414/940 |
| 5,630,690 | 5/1997 | Salzman | 414/940 |
| 5,653,565 | 8/1997 | Bonora et al. | 414/940 |
| 5,697,750 | 12/1997 | Fishkin et al. | 414/939 |
| 5,730,573 | 3/1998 | Masujima et al. | 414/940 |
| 5,788,458 | 8/1998 | Bonora et al. | 414/940 |
| 5,810,537 | 9/1998 | Briner et al. | 414/940 |
| 5,829,939 | 11/1998 | Iwai et al. | 414/940 |

Primary Examiner—Steven A. Bratlie
Attorney, Agent, or Firm—Darby & Darby

[57] ABSTRACT

A mechanical interface apparatus which is capable of loading semiconductor wafers stored in a sealed container into a processing apparatus without adversely affecting the surfaces of the semiconductor wafers due to exposure to external air or dust. When a sealed container 100 is placed on top of a processing apparatus 200, latch mechanisms 201 are activated to engage with a flange 103, so as to affix the container body 101. Then, valves 3 and 5 are opened to perform a gas purge, after which a drive mechanism provided inside a lock operating mechanism 220 is operated in order to withdraw lock arms 111 from concave portions 103a, thereby unlocking the bottom lid 110. Then, wafer cassettes 106 inside the container are lowered to a predetermined position by means of an in-apparatus elevator mechanism 202, and the wafer cassettes are loaded into the processing apparatus 200 by a cassette loading mechanism.

1 Claim, 28 Drawing Sheets

MECHANICAL INTERFACE APPARATUS

BACKGROUND OF THE INVENTION

1. Technical Field of the Invention

The present invention relates to mechanical interface apparatus provided in various types of processing apparatus for processing semiconductor wafers, for loading semiconductor wafers stored in sealed containers into the processing apparatus without exposing them to air.

2. Background Art

Conventionally, semiconductor devices are manufactured inside clean rooms which have cleansed interior atmospheres. Moreover, in order to prevent the adherence of the slightest amounts of dust in these clean rooms, the semiconductor wafers are often transported during the manufacturing process while stored inside wafer cassettes, which are themselves stored inside transportable sealed containers.

When the semiconductor wafers are stored inside these sealed containers, the sealed containers are filled with inert gases such as nitrogen in order to replace their interior atmospheres with inert gas, so as to prevent the formation of natural oxidation films or organic contaminants on the surfaces of the semiconductor wafers due to water vapor, oxygen, and other gases which may be present in the container atmosphere.

FIG. 22 shows the outward appearance of a sealed container as mentioned above, and FIG. 23 shows a cross-sectional view. In FIGS. 22 and 23, reference numeral 10 denotes a container body of a sealed container 100, having a flange 103 formed on a mouth portion 102. Reference numeral 104 denotes a handle 104 which is gripped by a human hand or a manipulator provided on a transport cart when the sealed container is being transported. Reference numeral 105 denotes a sealing material attached to the peripheral portion of a bottom lid, for keeping the sealed container airtight. Reference numeral 106 denotes a wafer cassette loaded with a plurality of semiconductor wafers, which is placed on the top surface of the bottom lid 110 when stored inside the sealed container 100.

The bottom lid 110 is hollow, and the interior is provided with a lock mechanism as shown in FIGS. 24 and 25. While FIG. 23 only shows the structure of the left half of the sealed container, the right half has an identical structure to the left half.

In FIG. 24, reference numeral 111 denotes a lock arm having a flattened rod shape. As shown in FIG. 25, the lock arm 111 has a rolling element 111a on one end, through which it is attached to a cam 112 so as to be capable of tilting and moving in a longitudinal direction. The other end of the lock arm 111 is fitted into a concave portion 103 formed on the inner circumferential surface of the flange 103 of the container body 102 when locked, thereby affixing the bottom lid 110 to the container body 101. Reference numeral 113 denotes support members which support the lock arm 111 near the center of the lock arm 111 in the longitudinal direction. Reference numeral 114 denotes a spring for biasing the lock arm 111 downward as shown in FIG. 24.

Reference numeral 120 denotes a lock operating mechanism provided with a gas purge unit for refilling the sealed container with inert gas, and various types of processing apparatus for processing semiconductor wafers, the interior of which has a cam shaft 121 the tip of which is in spline engagement with the cam 112 on the bottom lid 110, and a drive mechanism 122 for rotating the cam shaft 121. The lock operating mechanism 120 is capable of being moved up and down as seen in FIG. 24 by means of an elevator mechanism not shown in the drawings. When the sealed container is to be opened or closed, the lock operating mechanism 120 is raised into contact with the bottom lid 110 in order to lock or unlock the lock mechanism provided in the bottom lid 110.

That is, in the case of unlocking, the drive mechanism 122 rotates the cam shaft 121 which is in spline engagement with the cam 112 counterclockwise by a predetermined angle so as to withdraw the other end of the lock arm 111 from the concave portion 103a. In the case of locking, the other end of the lock arm 111 is inserted into the concave portion 103a by rotating the cam shaft 121 clockwise by a predetermined angle. Then, upon locking, the bottom lid 110 is brought into tight contact with and affixed to the container body 101 with the sealing material 105 pinched therebetween, so as to maintain the interior of the container so as to be airtight.

Conventionally, the various semiconductor wafer processing apparatus for processing semiconductor wafers in various ways (such as cleansing, surface treatment or film formation) have SMIF (standardized mechanical interface) systems for placing semiconductor wafers stored in sealed containers in such apparatus without contamination by particles from the external atmosphere. With reference to FIGS. 26 through 29, the operations involved in placing semiconductor wafers in sealed containers within the apparatus by means of an SMIF system will be explained.

Before explaining the operations, the structure of the SMIF system of the processing apparatus 200 will be explained with reference to FIGS. 26 through 29. In this case, the sealed container of FIGS. 26 through 29 is identical to the sealed container explained with reference to FIGS. 22 through 25, so the explanation will be omitted.

In FIG. 26, reference numeral 200 denotes a processing apparatus for performing a predetermined process on semiconductor wafers. The atmosphere within the apparatus is cleansed. Reference numeral 201 denotes latch mechanisms which move in the directions of the arrows E when a sealed container 100 is placed thereon, so as to engage with the flanges 103 and affix the container body 101 to the processing apparatus 200.

Reference numeral 202 denotes an in-apparatus elevator mechanism, attached with a lock operating mechanism 220, which moves up and down along a rail 203. In this case, the lock operating mechanism 220, like the lock operating mechanism 120 shown in FIG. 24, has a cam shaft 221 and a drive mechanism (not shown in the drawings), and locks and unlocks the bottom lid 110, but the main body of the lock operating mechanism 220 is provided with a flange 223. When the in-apparatus elevator mechanism 202 is at the highest position (the position of the in-apparatus elevator mechanism 202 as shown in FIGS. 26 and 27), the interior of the apparatus is made airtight due to the upper surface of the flange 223 coming into tight contact with the inner surface 205 at the periphery of the open portion 204 of the processing apparatus 200, thereby keeping the internal atmosphere clean.

The operations of the above-mentioned processing apparatus 200 will be explained next. First, as shown in FIG. 26, when a sealed container 100 is placed on the processing apparatus 200 by means of a manipulator, a cam (not shown in the drawing) in the bottom lid 110 of the sealed container comes into spline engagement with the cam shaft 221. When this is sensed by a sensor which is not shown in the drawings, the latch mechanisms 201 move in the directions of the arrows E so as to engage with the flanges 103, thereby affixing the container body 101 to the processing apparatus 200.

Next, as shown in FIG. 27, the drive mechanism (not shown in the drawings) in the lock operating mechanism 220 is activated so as to rotate the cam shaft 221 by a predetermined angle, and withdraw the other end of the lock arm 111 from the concave portion 103a. This unlocks the bottom lid 110, after which the in-apparatus elevator mechanism 202 is lowered to a predetermined position with the bottom lid 110 carrying the wafer cassettes 106 still placed on the top surface of the lock operating mechanism 220, as shown in FIG. 28. Then, the wafer cassettes 106 are loaded into the processing apparatus 200 by means of cassette loading mechanisms or the like (not shown in the drawing) which are provided inside the apparatus, as shown in FIG. 29.

In this manner, a processing apparatus having an SMIF system allows semiconductor wafers to be removed from sealed containers without being exposed to the external air, thereby keeping the semiconductor wafers from being contaminated with dust or the like which can exist in the external air.

As shown in FIG. 30, the above-mentioned SMIF system is such that there is a possibility of dust from the clean room adhering to the bottom surface A of the bottom lid 110, and the gap B formed by the outer circumferential surface of the bottom lid 110 and the inner circumferential surface of the flange 103, which are exposed to the external air when the sealed container 100 is moved. Additionally, on the side of the processing apparatus 200, there is a possibility of dust adhering to the top surface C or the lock operating mechanism 220, and the gap formed by the outer circumferential surface 220a of the lock operating mechanism 220 and the inner circumferential surface 204a of the opened portion of the processing device 200 when the sealed container 100 is not in place.

Furthermore, since the bottom lid 110 has a hollow structure as mentioned previously, there is the risk of dust penetrating into the bottom lid 110 through the slight gap formed between the lock arm 111 and the hole for allowing the other end of the lock arm 111 to pass through from the interior of the bottom lid 110.

When dust has adhered to the gap B or the gap D, or when dust has penetrated inside the bottom lid 110, there is a risk of the dust penetrating into the processing apparatus and adhering to the semiconductor wafer when the semiconductor wafers are loaded into the processing apparatus. Additionally, the bottom surface A of the bottom lid 110 and the top surface C of the lock operating mechanism 220 are brought into contact when the sealed container 100 is placed on the lock operating mechanism 220, but gaps may form depending on the work precision of the surfaces, so that dust sticking therein may penetrate into the processing apparatus 20.

Furthermore, external air penetrates into the bottom lid 110 when the sealed container 100 is being transported, and the spaces formed in the gaps B and D are filled with external air when the sealed container 100 is placed on the processing apparatus 200, so that when the sealed container 100 is filled with an inert gas such as $N_2$ gas, the external air existing in the spaces can contact the semiconductor wafers during the unlocking of the lock mechanism for loading the semiconductor wafers 106 into the processing apparatus 200, which may adversely affect the wafer surfaces.

SUMMARY OF THE INVENTION

The present invention has been achieved in consideration of these conditions, and has the object of offering a mechanical interface apparatus which is capable of loading semiconductor wafers stored in sealed containers into processing apparatus without adversely affecting the semiconductor wafer surfaces due to external air or dust.

In order to achieve this object, the present invention offers a mechanical interface apparatus, equipped on a processing apparatus for applying a predetermined process to the contents of a sealed container composed of a container body, a lid which is capable of sealing a mouth portion of the container body in an airtight manner, and a lock mechanism which is capable of locking and unlocking the lid by means of external operation, for loading the contents into the processing apparatus without exposure to external air, comprising elevator means which is capable of moving up and down within the processing apparatus; sealing means provided on the elevator means, containing a lid opening/closing mechanism for operating the lock mechanism for sealing a mouth portion provided on the processing apparatus for loading the lid and the contents from inside the processing apparatus when the elevator means is at a maximum elevation; gas supply means for supplying gas to a space formed by the sealed container, the sealing means and the processing apparatus when the sealed container is placed on the mouth portion; and gas exhaust means for exhausting gas from the space formed by the sealed container, the sealing means and the processing apparatus to an outside portion; wherein when the sealed container has been placed on the mouth portion of the processing apparatus, gas is supplied by the gas supply means and the atmosphere in the space formed by the sealed container, the sealing means and the processing apparatus is exhausted so as to replace the space with the gas, before the lid opening/closing mechanism unlocks the lock mechanism.

PREFERRED EMBODIMENTS OF THE INVENTION

Hereinbelow, the embodiments of the present invention will explained with reference to the drawings.

FIRST EMBODIMENT

A mechanical interface apparatus according to the first embodiment will be explained with reference to FIGS. 1 through 4. First, the structure of the mechanical interface apparatus 1 according to the present invention will be explained with reference to FIG. 1.

Figure 1:
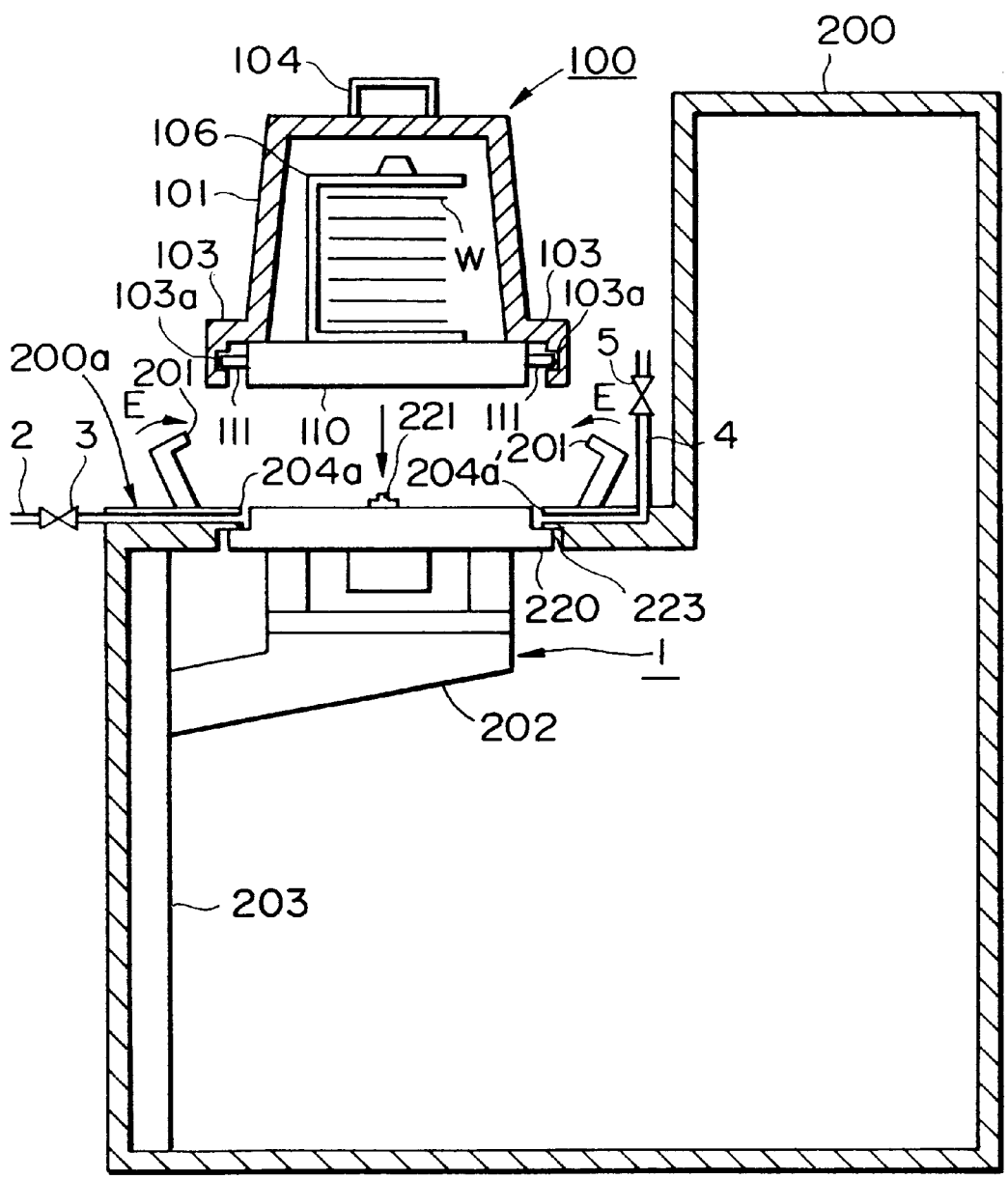
FIG. 1 is a diagram explaining the structure of a mechanical interface apparatus according to a first embodiment of the present invention and the procedure for loading semiconductor wafers stored in a sealed container into a processing apparatus.
Figure 26:
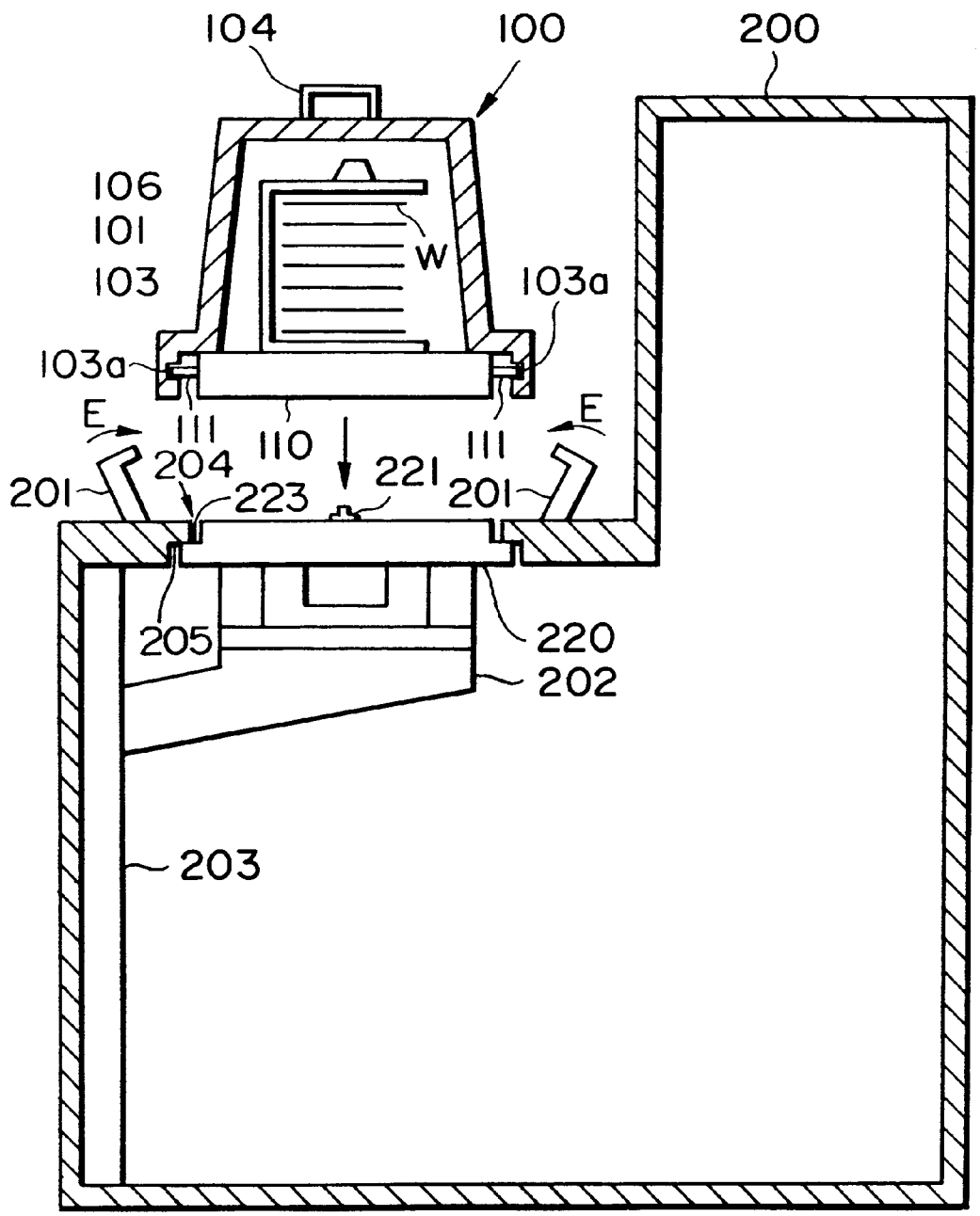
FIG. 26 is diagram explaining the structure of a conventional mechanical interface apparatus and the procedure for loading semiconductor wafers stored in a sealed container into a processing apparatus.
Figure 27:
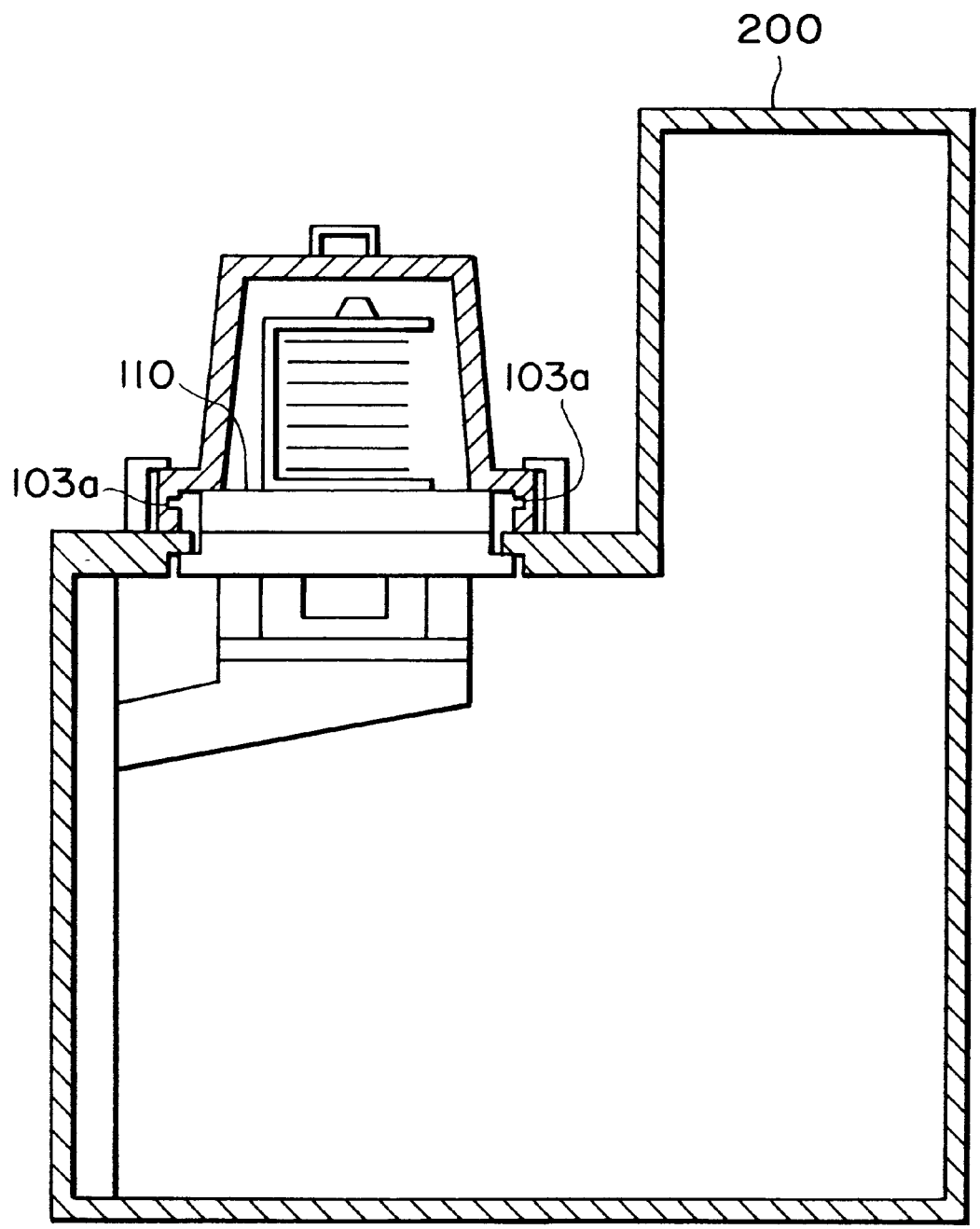
FIG. 27 is a diagram explaining the procedure for loading semiconductor wafers stored in a sealed container into a processing apparatus with the same mechanical interface apparatus.
Figure 28:
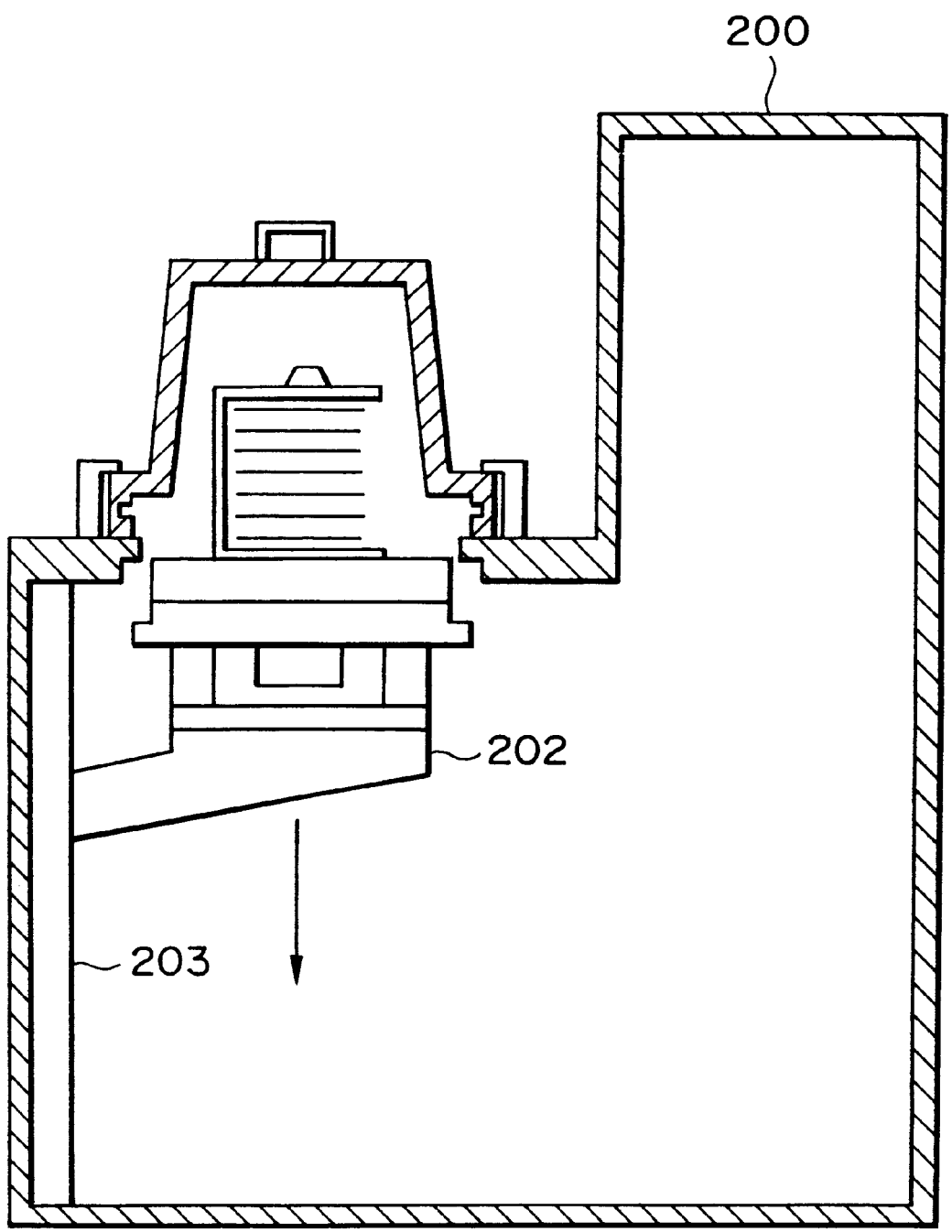
FIG. 28 is a diagram explaining the procedure for loading semiconductor wafers stored in a sealed container into a processing apparatus with the same mechanical interface apparatus.
Figure 29:
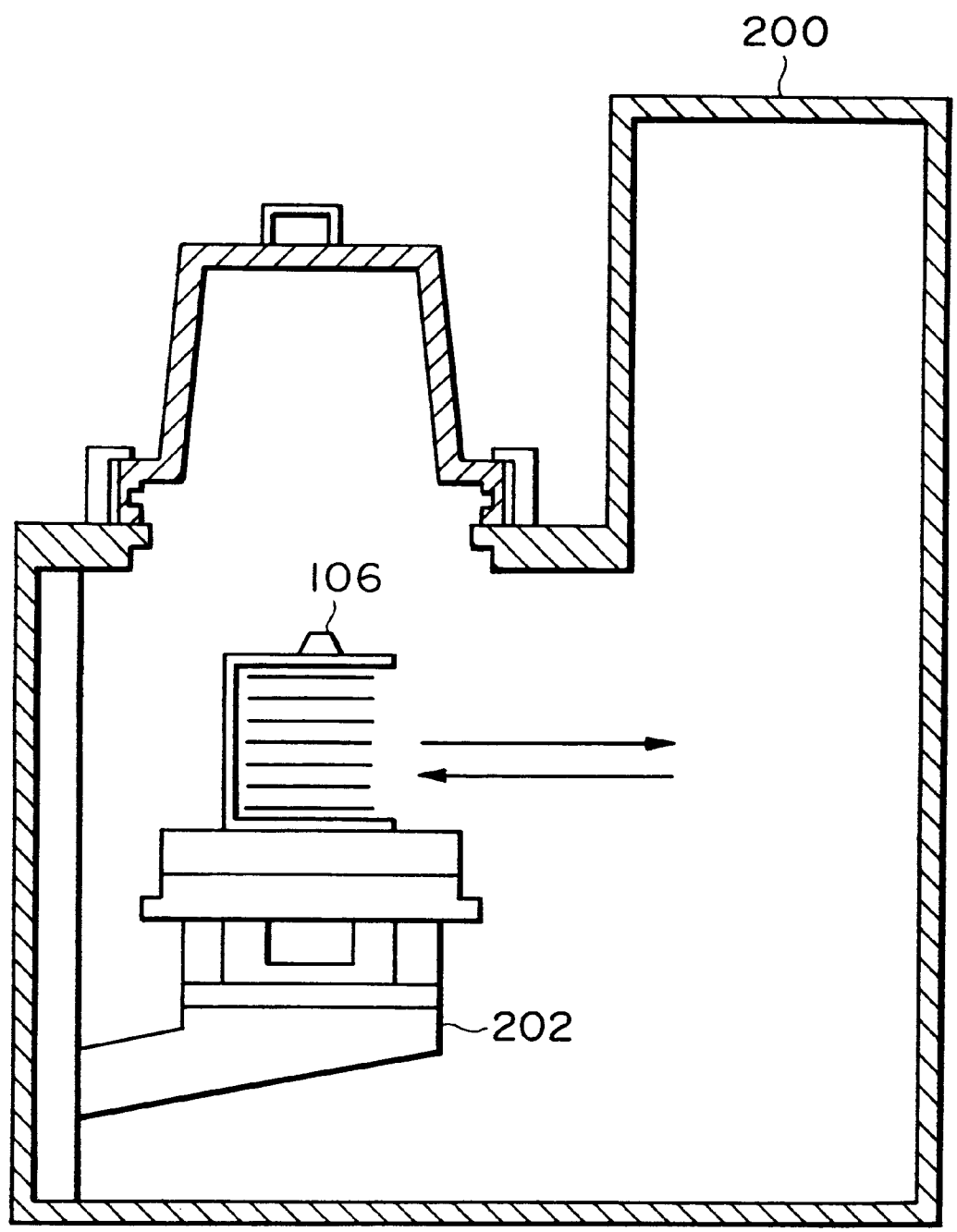
FIG. 29 is a diagram explaining the procedure for loading semiconductor wafers stored in a sealed container into a processing apparatus with the same mechanical interface apparatus.
Figure 30:
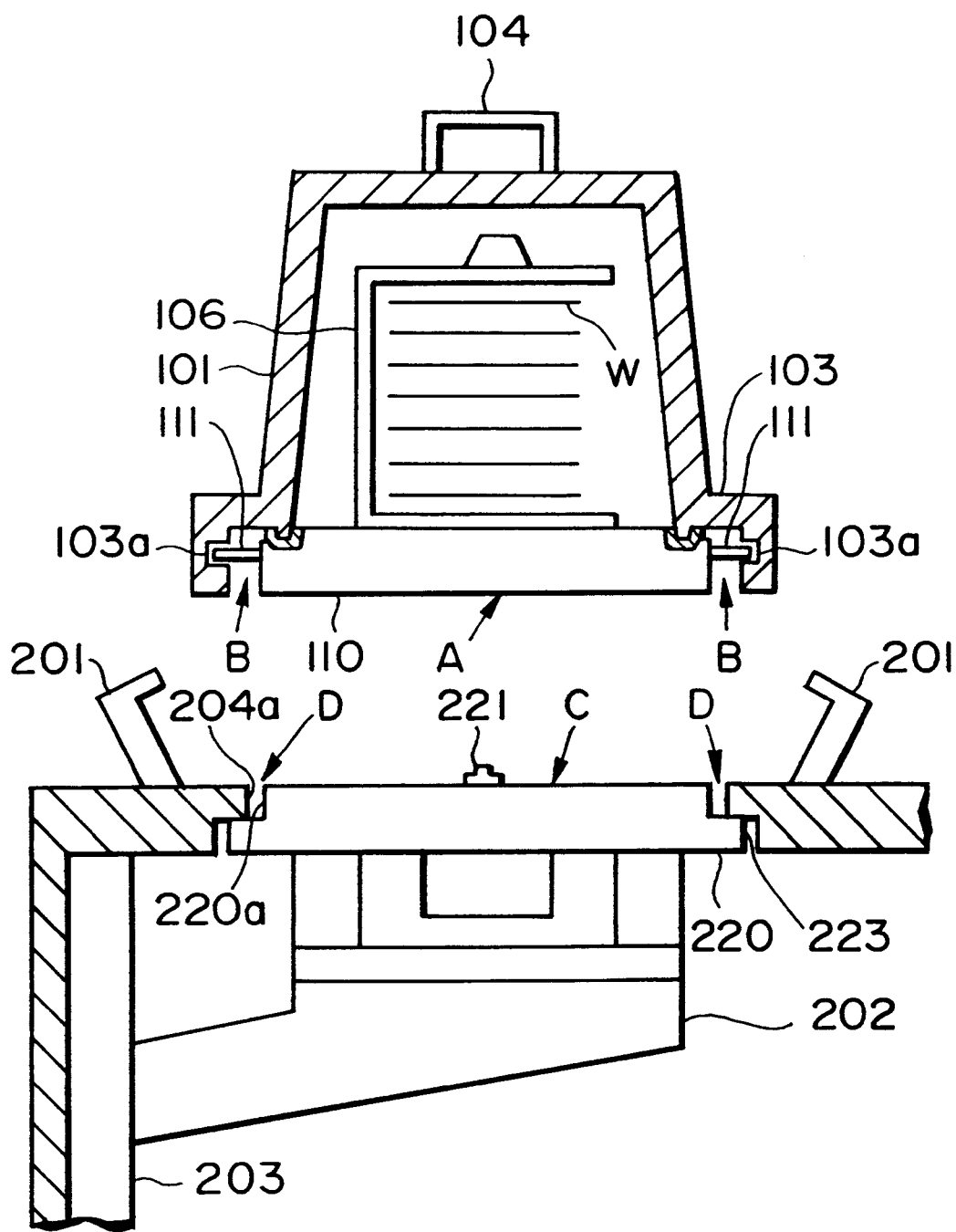
FIG. 30 is a diagram explaining portions where there is a risk of dust adhering in conventional mechanical interface apparatus, and portions where there is a risk of dust adhering when the sealed container is being transported.

In FIG. 1, the portions which correspond to portions shown in FIGS. 26 and 30 are given the same reference numerals, and their explanation is omitted. The mechanical interface apparatus 1 shown in FIG. 1 differs from that of FIG. 26 with regard to the following points.

Reference numeral 2 denotes a supply pipe provided in the top wall 200a of the processing apparatus 200, one end of which opens onto the inner circumferential surface 204a of the open portion of the processing apparatus, and the other end of which is connected to an inert gas tank (not shown in the drawing) by way of a valve 3. Reference numeral 4 denotes an exhaust pipe provided in the top wall 200a of the processing apparatus 200 like the supply pipe 2, one end of which opens onto the inner circumferential surface 204a of the open portion of the processing apparatus, and the other end of which opens onto the outside of the processing apparatus 200 by way of a valve 5.

Next, the operation of loading wafer cassettes 106 stored in sealed containers into a processing apparatus 200 by means of a mechanical interface apparatus according to the present embodiment will be explained with reference to FIGS. 1 through 4.

First, with reference to FIG. 1, when a sealed container 100 is placed on top of a lock operating mechanism 220 of the processing apparatus 200 by means of a manipulator or the like, a cam (not shown in the drawing) in the bottom lid 110 of the sealed container comes into spline engagement with the cam shaft 221. When this is sensed by a sensor which is not shown in the drawings, the latch mechanisms 201 move in the directions of the arrows E so as to engage with the flanges 103, thereby affixing the container body 101 to the top wall 200a.

Figure 2:
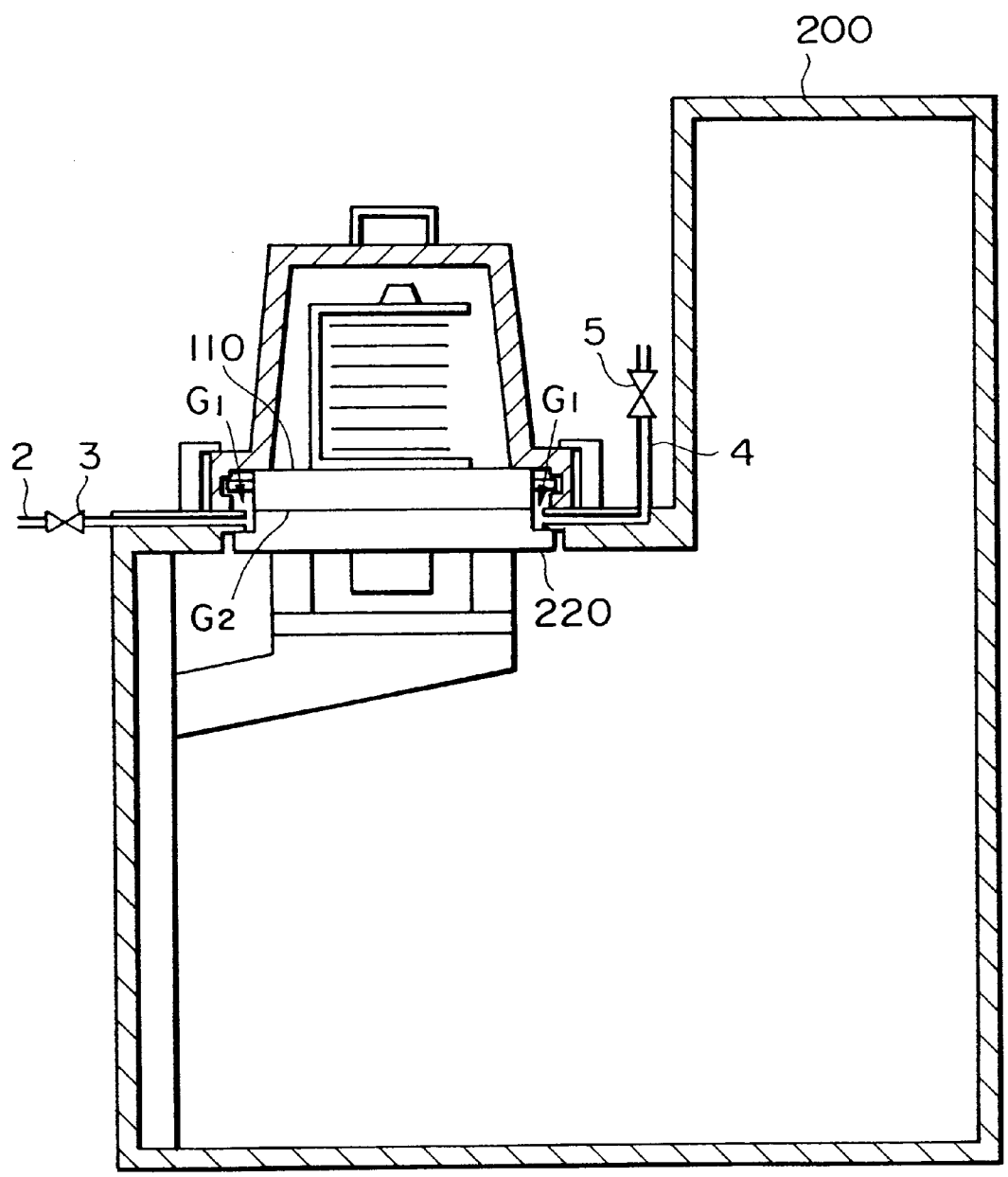
FIG. 2 is a diagram explaining the procedure for loading semiconductor wafers stored in a sealed container into a processing apparatus with the same mechanical interface apparatus.

As seen in FIG. 2, valve 3 and valve 5 are next opened to perform a gas purge. That is, opening valve 3 and valve 5 causes inert gas (for example, $N_2$ gas) supplied from the inert gas tank (not shown in the drawings) through the supply pipe 2 to flow into the gap G1 which is the space formed by the unification of gaps B and D of FIG. 30, the slight gap G2 formed between the bottom surface of the bottom lid 110 and the top surface of the lock operating mechanism 220, and the interior of the bottom lid 110; and the gas which was present in these gaps is exhausted to the outside through the exhaust pipe 4 and the valve 5, so as to replace the atmosphere within these gaps with a high concentration of inert gas. At the same time, any dust adhering to the bottom surface of the bottom lid 110 during transport of the sealed container 100 and any external air flowing into the bottom lid 110 is exhausted to the outside along with the gas in the gaps.

Figure 3:
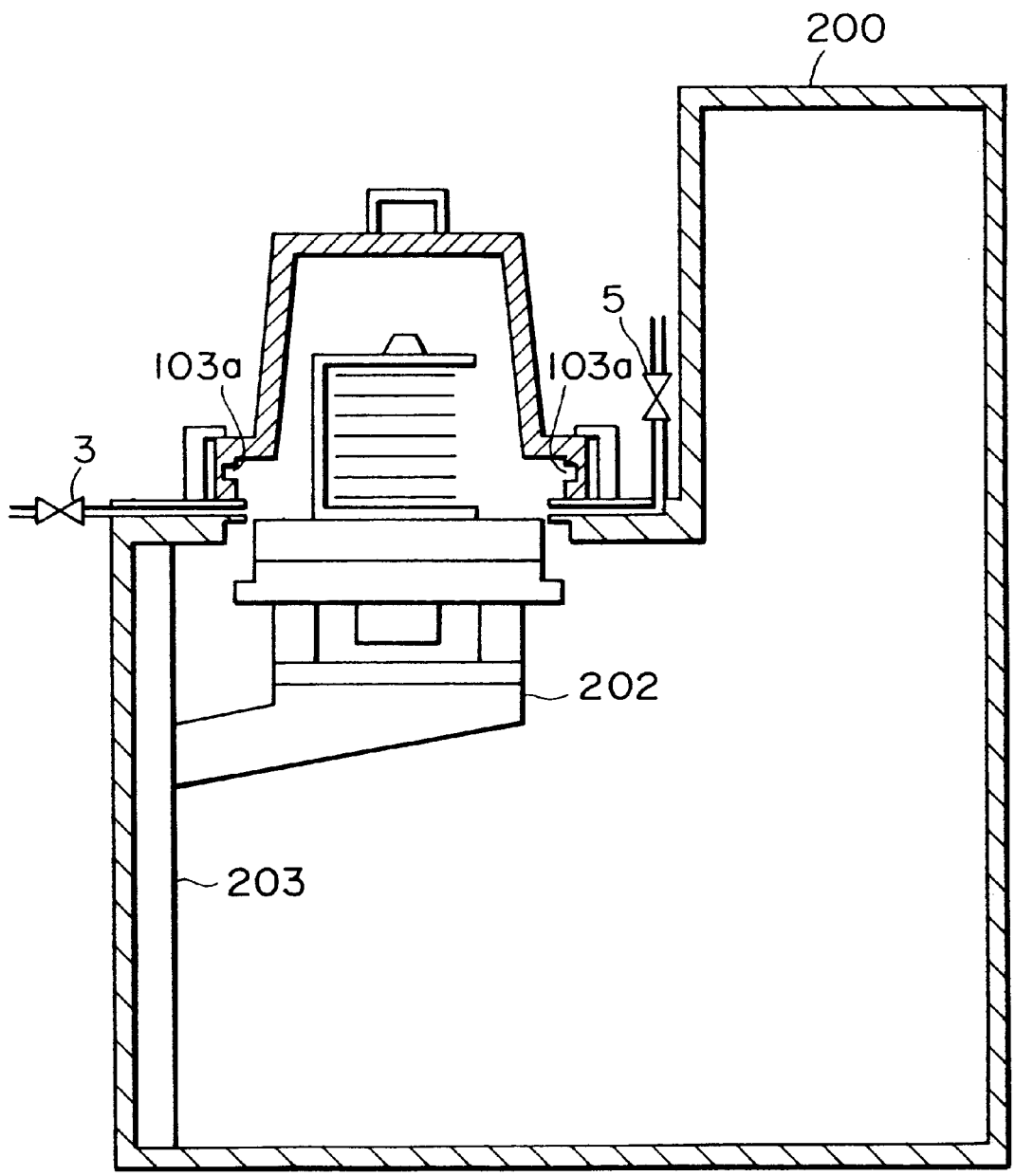
FIG. 3 is a diagram explaining the procedure for loading semiconductor wafers stored in a sealed container into a processing apparatus with the same mechanical interface apparatus.
Figure 4:
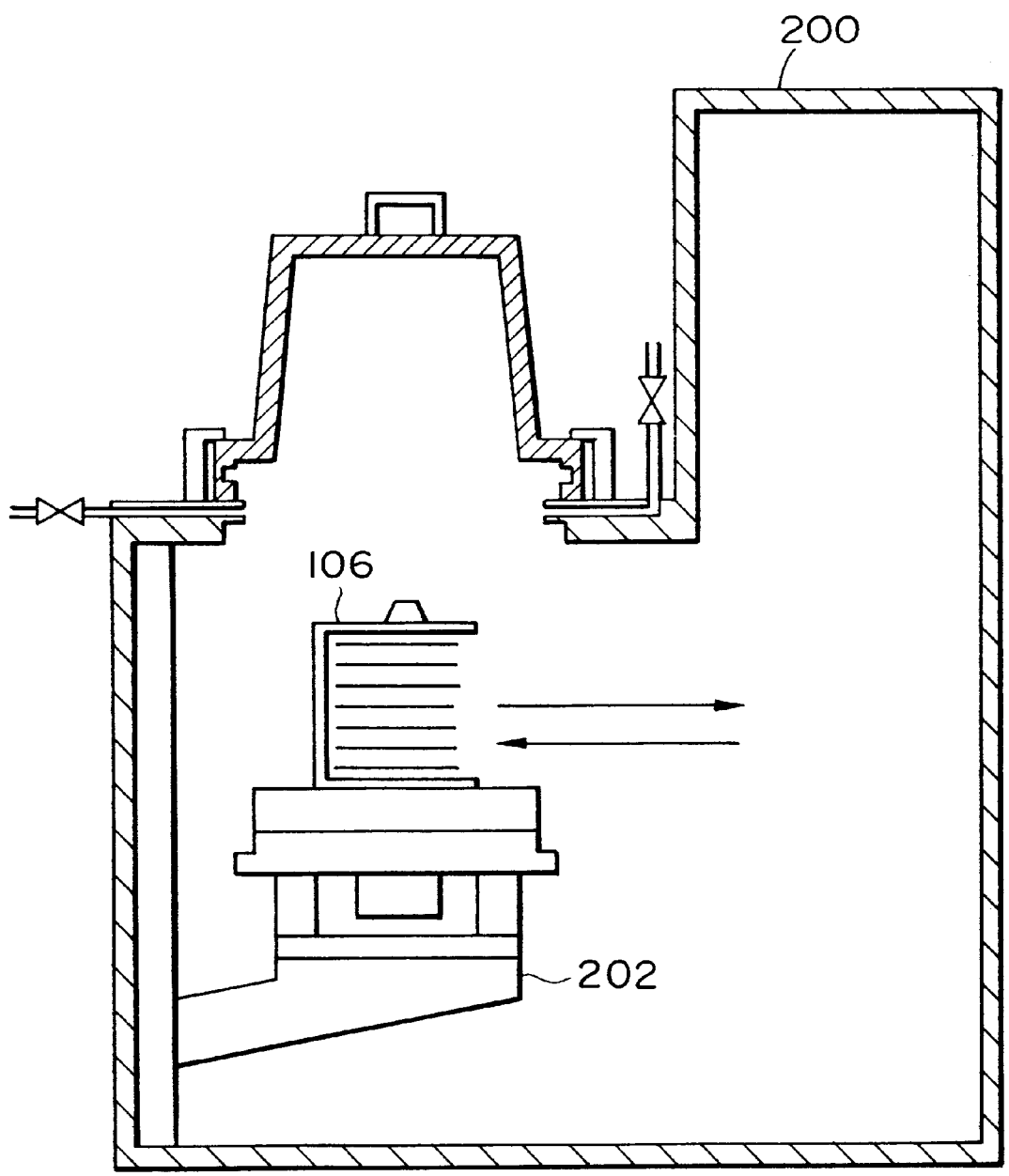
FIG. 4 is a diagram explaining the procedure for loading semiconductor wafers stored in a sealed container into a processing apparatus with the same mechanical interface apparatus.

Then, after performing a gas purge for a predetermined period of time, the inert gas supply is stopped and the external air is cut off by closing the valves 3 and 5 in FIG. 3, then the drive mechanism provided inside the lock operating mechanism 220 is activated so as to rotate the cam shaft 221 counterclockwise through a predetermined angle and withdraw the lock arm 111 from the concave portion 103a. When the lock in the bottom lid 110 is released, the in-apparatus elevator mechanism 202 begins to be lowered along the rail 203. When it is lowered to a predetermined position as shown in FIG. 4, the wafer cassettes 106 are loaded into the processing apparatus 200 by means of a cassette loading mechanism (not shown in the drawing) provided inside the apparatus.

Additionally, when the wafer cassettes 106 are to be removed from the processing apparatus 200, the above-mentioned operations can be performed in reverse, in the order to FIG. 4 to FIG. 3 to FIG. 2 to FIG. 1, but the gas purge of FIG. 2 may be omitted.

In this way, with the mechanical interface apparatus according to the present embodiment, a gas purge is performed before the lock in the bottom lid of the sealed container is released so as to remove dust adhering to the surfaces of the sealed container and the semiconductor wafer processing apparatus which contact external air, thereby eliminating the risk of the semiconductor wafers being contaminated by dust or the like when the semiconductor wafers in the sealed container are loaded into the apparatus and eliminating the risk of adversely affecting the surfaces of the semiconductor wafers by external air mixed into gaps and the interior of the bottom lid 110.

SECOND EMBODIMENT

Next, a mechanical interface apparatus according to the second embodiment will be explained with reference to FIGS. 5 through 8. First, the structure of the mechanical interface apparatus 10 according to the present embodiment will be explained with reference to FIG. 5.

Figure 5:
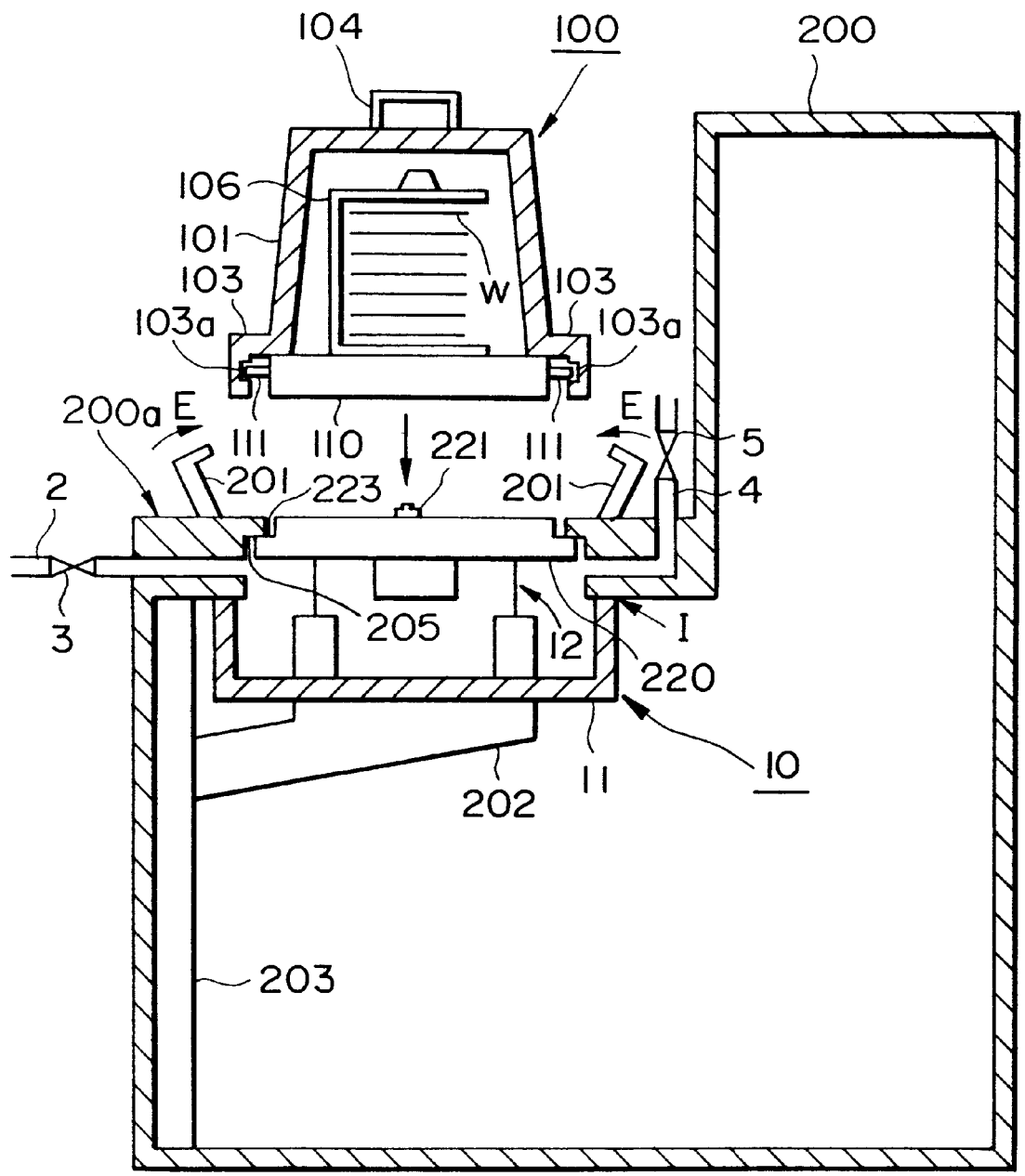
FIG. 5 is a diagram explaining the structure of a mechanical interface apparatus according to a second embodiment of the present invention and the procedure for loading semiconductor wafers stored in a sealed container into a processing apparatus.
Figure 6:
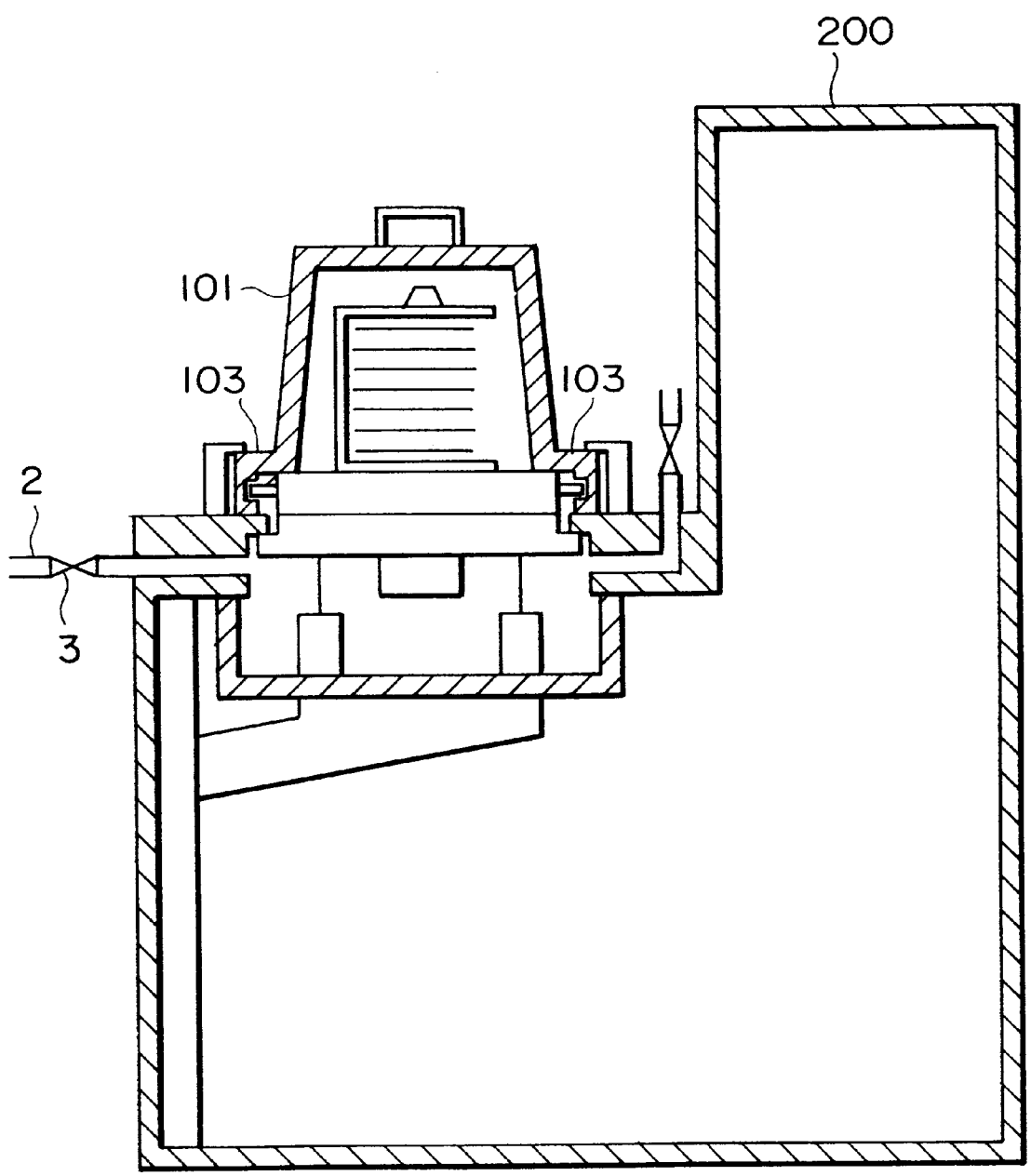
FIG. 6 is a diagram explaining the procedure for loading semiconductor wafers stored in a sealed container into a processing apparatus with the same mechanical interface apparatus.

In FIG. 5, the portions corresponding to portions shown in FIG. 1 are given the same reference numerals and their explanation will be omitted. The mechanical interface apparatus shown in FIG. 5 is different from that of FIG. 1 with regard to the following points.

Reference numeral 11 denotes an airtight chamber provided inside the processing apparatus 200, having a box-shape having an open top surface. Additionally, when the in-apparatus elevator mechanism 202 is at the highest position (the position of the in-apparatus elevator mechanism 202 as shown in FIG. 5), the peripheral portion on the open surface side of the airtight chamber 11 comes into tight contact with the inner surface I around the open portion in the top wall 200a of the processing apparatus, thereby making the airtight chamber 11 airtight.

Reference numeral 12 denotes an in-chamber elevator mechanism provided inside the airtight chamber 11, for raising and lowering the lock operating mechanism 220 inside the airtight chamber 11. In FIG. 5, the in-chamber elevator mechanism 12 is at the highest position, in which state the top surface of the flange 223 provided on the lock operating mechanism 220 comes into tight contact with the inner surface 205 on the periphery of the open portion of the processing apparatus 200, thereby making the interior of the processing apparatus 200 airtight.

Additionally, in the present embodiment, one end of each of a supply pipe 2 and an exhaust pipe 4 opens onto the inner circumferential surface of the open portion of the processing apparatus 200 which forms a portion of the space made airtight by the airtight chamber 11.

Hereinbelow, the operations whereby the semiconductor processing apparatus loads the wafer cassettes 106 into the airtight chamber in the present embodiment will be explained with reference to FIGS. 5 through 8.

First, as shown in FIG. 5, a sealed container 100 is placed on top of a lock operating mechanism 220 of the processing apparatus 200 bar means of a manipulator or the like, upon which a cam (not shown in the drawing) inside the bottom lid 11 of the sealed container comes into spline engagement with a cam shaft 221. When a sensor (not shown in the drawing) senses this, the latch mechanisms 201 move in the direction of the arrows E in the drawing so as to engage with the flange 103, thereby affixing the container body 101 (see FIG. 6).

Figure 7:
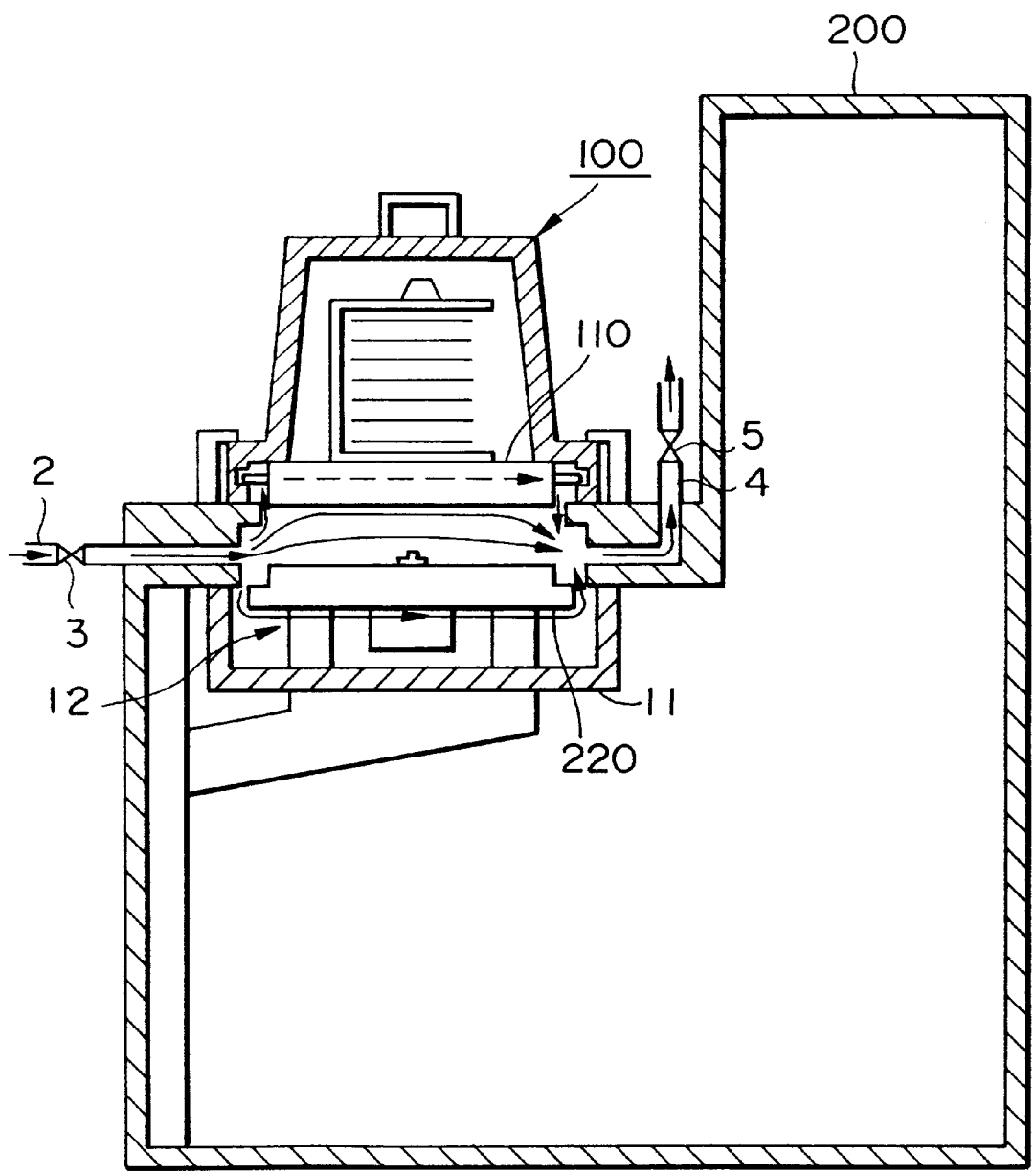
FIG. 7 is a diagram explaining the procedure for loading semiconductor wafers stored in a sealed container into a processing apparatus with the same mechanical interface apparatus.

In FIG. 7, only the lock operating mechanism 220 is lowered by lowering the in-chamber elevator mechanism 12 with the bottom lid 110 still locked, in order to perform a gas purge by opening valves 3 and 5. As a result, dust adhering to the bottom surface of the bottom lid 110 or penetrating inside the bottom lid 110 during transport of the sealed container 100, and dust adhering to the surface of the lock operating mechanism 220 is exhausted outside of the apparatus through the exhaust pipe 4 and the valve 5.

Figure 8:
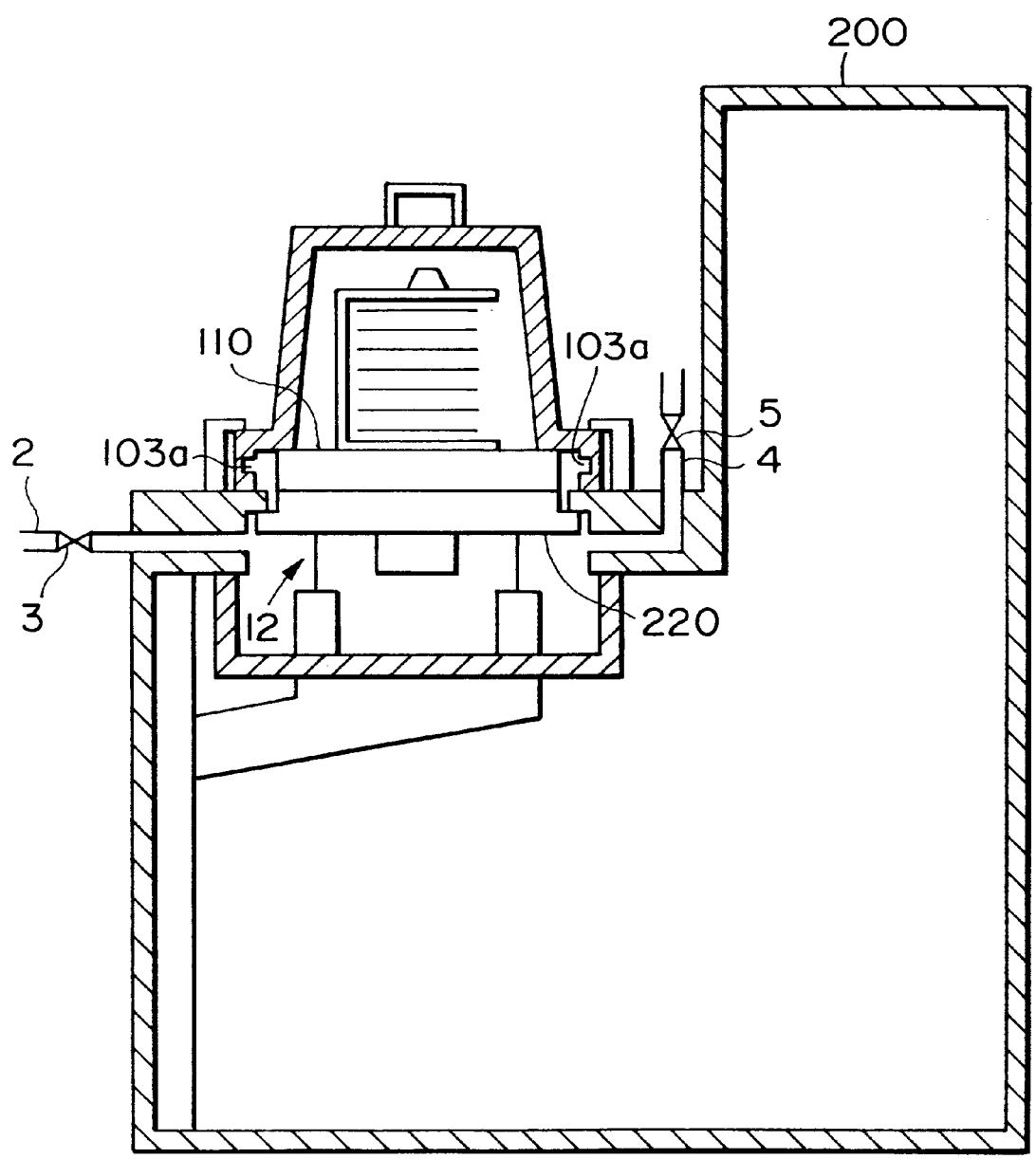
FIG. 8 is a diagram explaining the procedure for loading semiconductor wafers stored in a sealed container into a processing apparatus with the same mechanical interface apparatus.

After performing a gas purge for a predetermined period of time, the valves 3 and 5 are closed as shown in FIG. 8, the in-chamber elevator mechanism is raised to once again achieve a spline engagement between the cam inside the bottom lid 110 and the cam shaft 221, and the drive mechanism inside the lock operating mechanism 220 is activated to rotate the cam shaft 221 counterclockwise over a predetermined angle so as to withdraw the lock arms 111 from the concave portions 103a and unlock the bottom lid 110.

Figure 9:
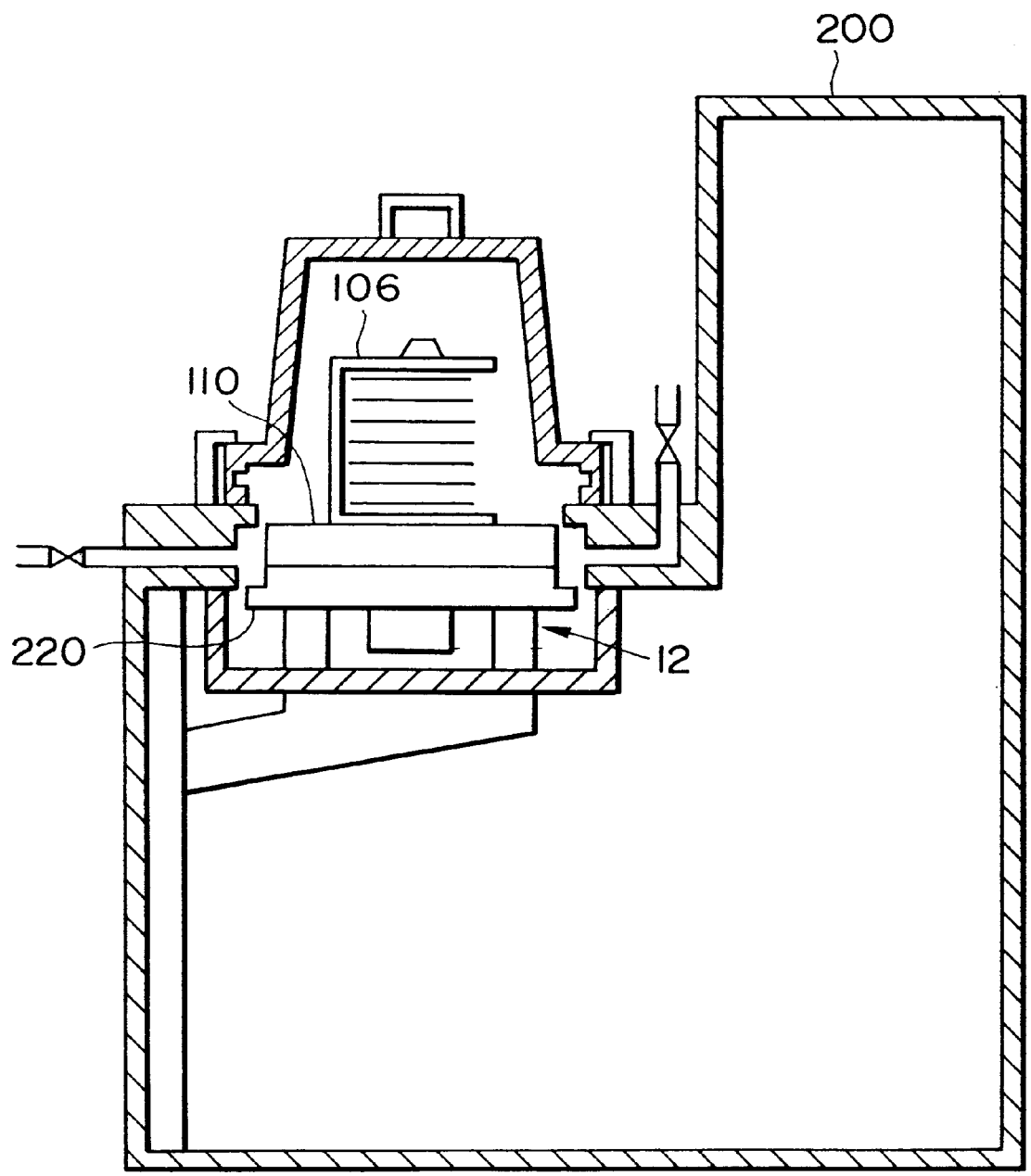
FIG. 9 is a diagram explaining the procedure for loading semiconductor wafers stored in a sealed container into a processing apparatus with the same mechanical interface apparatus.
Figure 10:
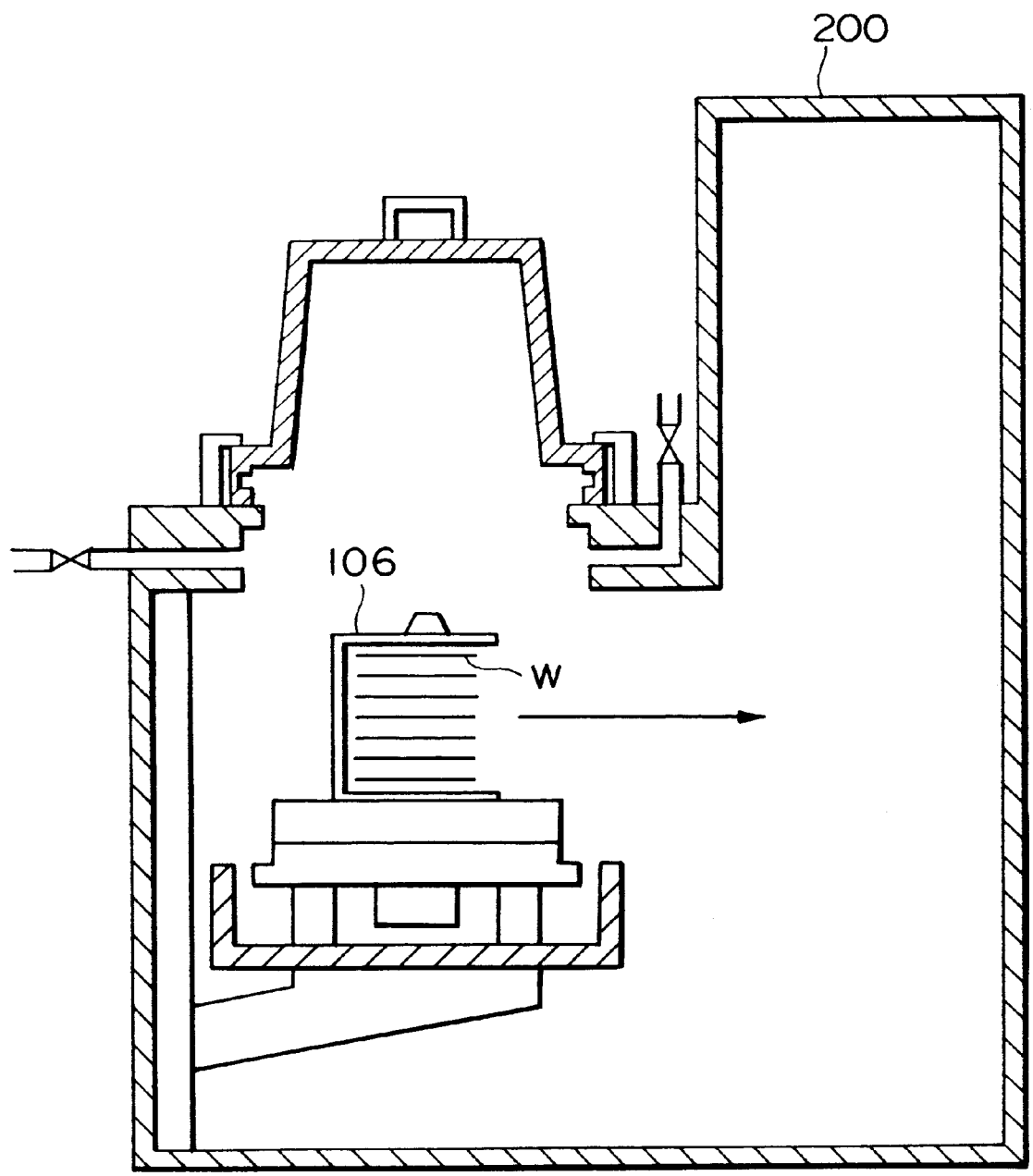
FIG. 10 is a diagram explaining the procedure for loading semiconductor wafers stored in a sealed container into a processing apparatus with the same mechanical interface apparatus.

Next, the in-chamber elevator mechanism 12 is operated to lower the wafer cassettes 106 along with the bottom lid 110 which is placed on the lock operating mechanism 220 as shown in FIG. 9, then the in-apparatus elevator mechanism 202 is lowered along the rail 203 as shown in FIG. 10. When lowered to a predetermined position, the wafer cassettes 106 are loaded into the processing apparatus 200 by means of a cassette loading mechanism (not shown in the drawing) provided inside the apparatus.

With the mechanical interface apparatus 10 of the present embodiment, it is possible to omit the step shown in FIG. 9 when the wafer cassettes 106 stored inside the sealed container 100 are loaded into the apparatus, in which case the wafer cassettes 106 are loaded into the apparatus while the in-chamber elevator mechanism 12 remains at the highest position.

The above-explained embodiment of the mechanical interface apparatus 10, has an airtight chamber 11, so as to allow a gas purge to be performed after the bottom lid 110 and the lock operating mechanism 220 have been separated as shown in FIG. 7, as a result of which it is possible to more effectively exhaust dust adhering to the bottom surface of the bottom lid 110 and the top surface of the lock operating mechanism 220 outside of the apparatus.

THIRD EMBODIMENT

Next, a mechanical interface apparatus according to a third embodiment will be explained with reference to FIGS. 11 through 14. First, the structure of the mechanical interface apparatus according to the present embodiment will be explained with reference to FIG. 11.

Figure 11:
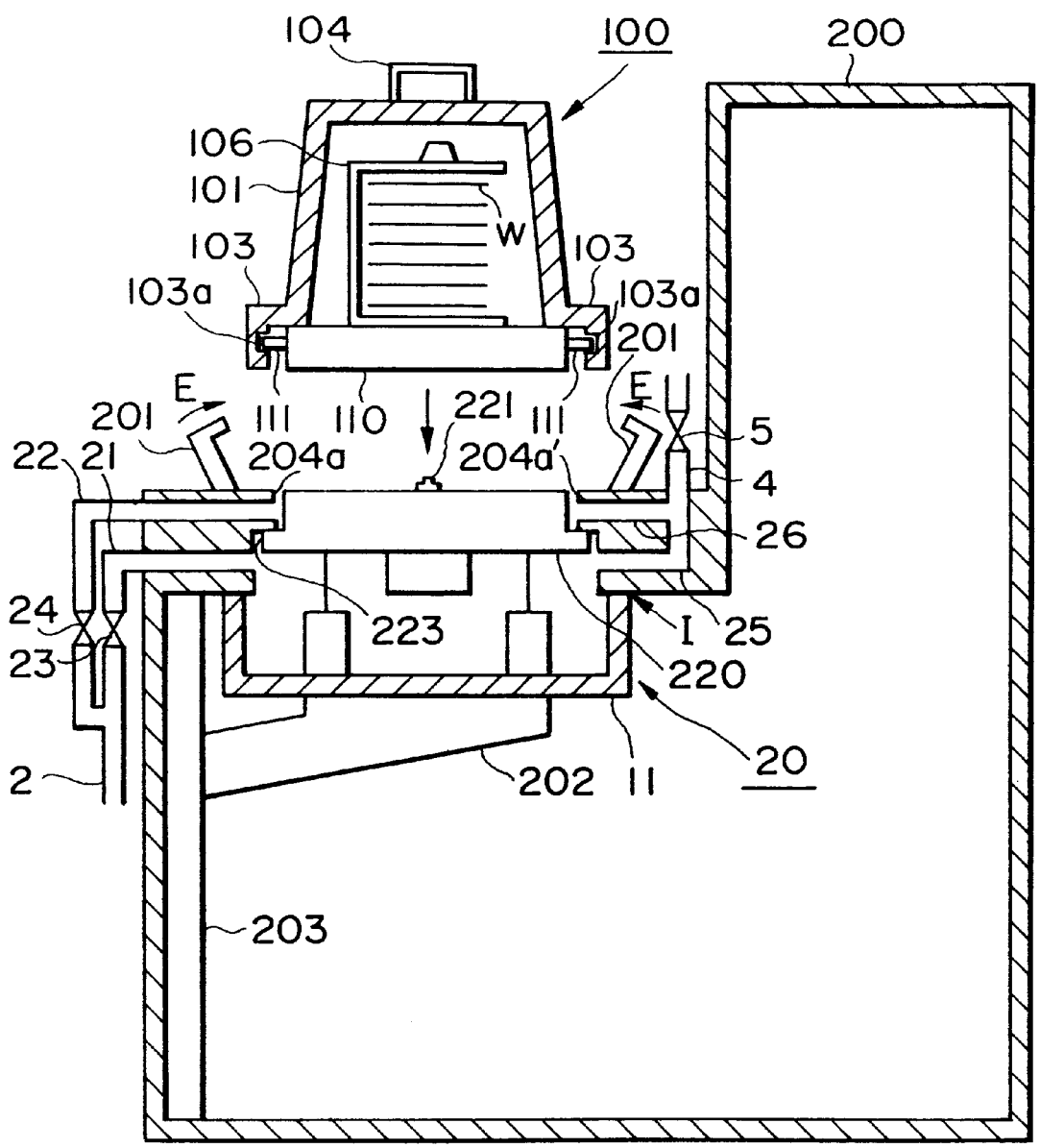
FIG. 11 is a diagram explaining the structure of a mechanical interface apparatus according to a third embodiment of the present invention and the procedure for loading semiconductor wafers stored in a sealed container into a processing apparatus.

In FIG. 11, the portions corresponding to portions shown in FIG. 5 are given the same reference numerals, and their explanations will be omitted. The mechanical interface apparatus 20 shown in FIG. 11 is different from that of FIG. 5 with regard to the following points.

Reference numerals 21 and 22 denote branch supply pipes branched from the supply pipe 2. One end of the branch supply pipe 21 opens onto a space made airtight by the airtight chamber 11 on the inner circumferential surface of the open portion of the processing apparatus 200. One end of the branch supply pipe 22 opens onto the inner circumferential surface 204a of the open portion of the processing apparatus 200. Additionally, reference numeral 23 denotes an open/close valve inserted at an intermediate portion of the branch supply pipe 21, and reference numeral 24 denotes an open/close valve inserted at an intermediate portion of the branch supply pipe 22.

Additionally, reference numerals 25 and 26 denote branch exhaust pipes branched from the exhaust pipe 4. One end of the branch supply pipe 25 opens onto the inner circumferential surface of the open portion of the processing apparatus which forms a part of the space made airtight by the airtight chamber 11. One end of the branch exhaust pipe 26 opens onto the inner circumferential surface 204a' of the open portion of the processing apparatus 200.

Hereinbelow, the operations whereby the mechanical interface apparatus 20 according to the present embodiment loads the wafer cassettes 106 stored inside a sealed container into the apparatus will be explained with reference to FIGS. 11 through 14.

First, with reference to FIG. 11, a sealed container 100 is placed on top of the lock operating mechanism 220 of the processing apparatus by means of a manipulator or the like, upon which a cam (not shown in the drawing) inside the bottom lid 110 of the sealed container comes into spline engagement with the cam shaft 221. When a sensor (not shown in the drawing) senses this, the latch mechanisms move in the direction of the arrows E to engage with the flange 103 in order to affix the container body 101 onto the top surface of the top wall 200a of the processing apparatus.

Figure 12:
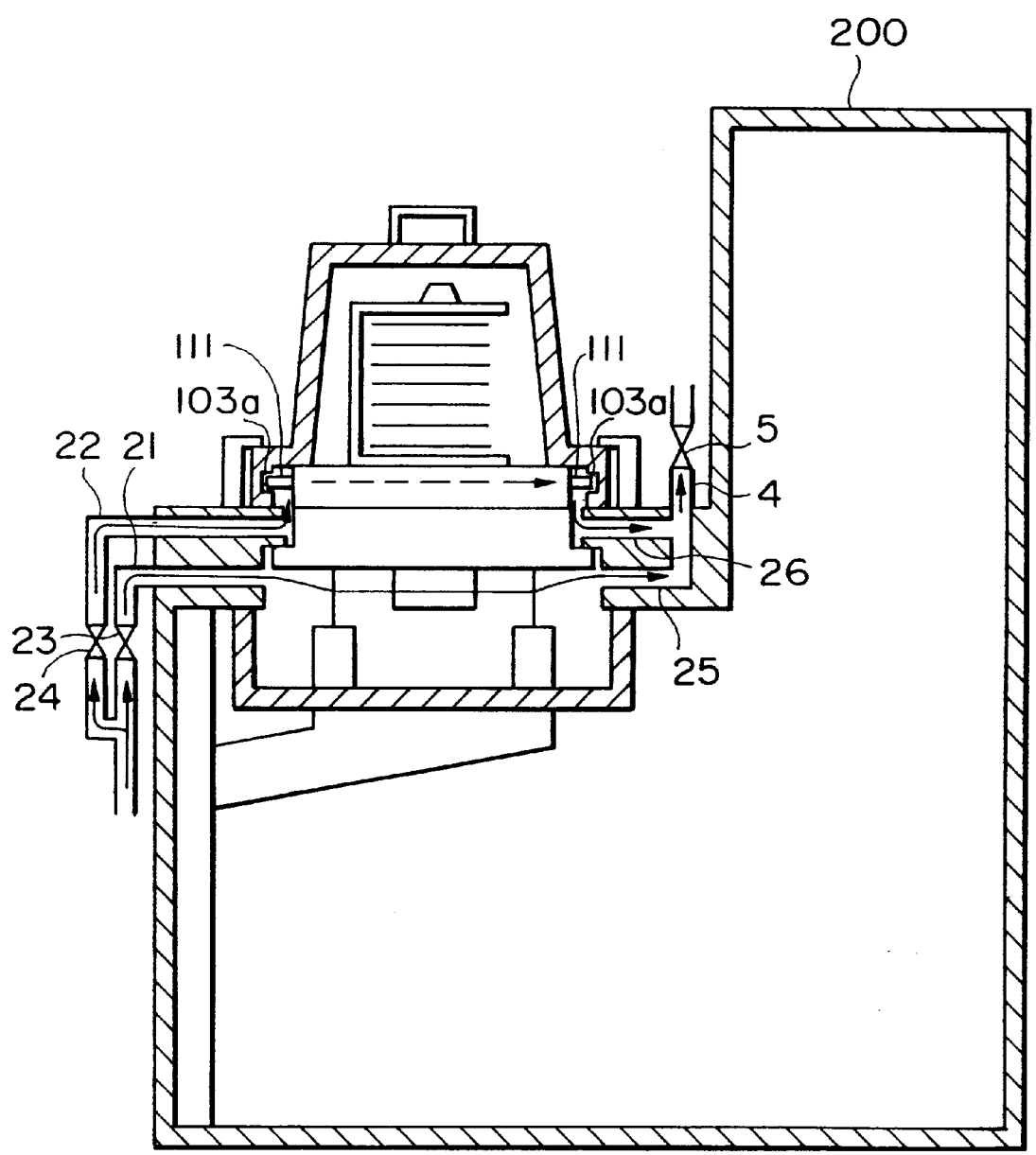
FIG. 12 is a diagram explaining the procedure for loading semiconductor wafers stored in a sealed container into a processing apparatus with the same mechanical interface apparatus.

As shown in FIG. 12, the valves 23, 24 and 5 are opened in order to perform a gas purge. As a result, dust adhering to the bottom surface of the bottom lid 110 or penetrating inside the bottom lid 110 during transport of the sealed container 100, and dust adhering to the surface of the lock operating mechanism 220 is exhausted outside of the apparatus through the branch exhaust pipe 26, the exhaust pipe 4 and the valve 5. Thus, the gas present inside the airtight chamber 11 is exhausted outside of the apparatus through the branch exhaust pipe 25, the exhaust pipe 4 and the valve 5 to replace the interior of the airtight chamber 11 with a high concentration of inert gas.

When the gas purge has been performed for a predetermined period of time, the valves 23, 24 and 5 are closed to stop the supply of inert gas and cut off the external air, then the drive mechanism provided inside the lock operating mechanism 220 is activated so as to rotate the cam shaft 221 counterclockwise over a predetermined angle and withdraw the lock arms 111 from the concave portions 103a.

Figure 13:
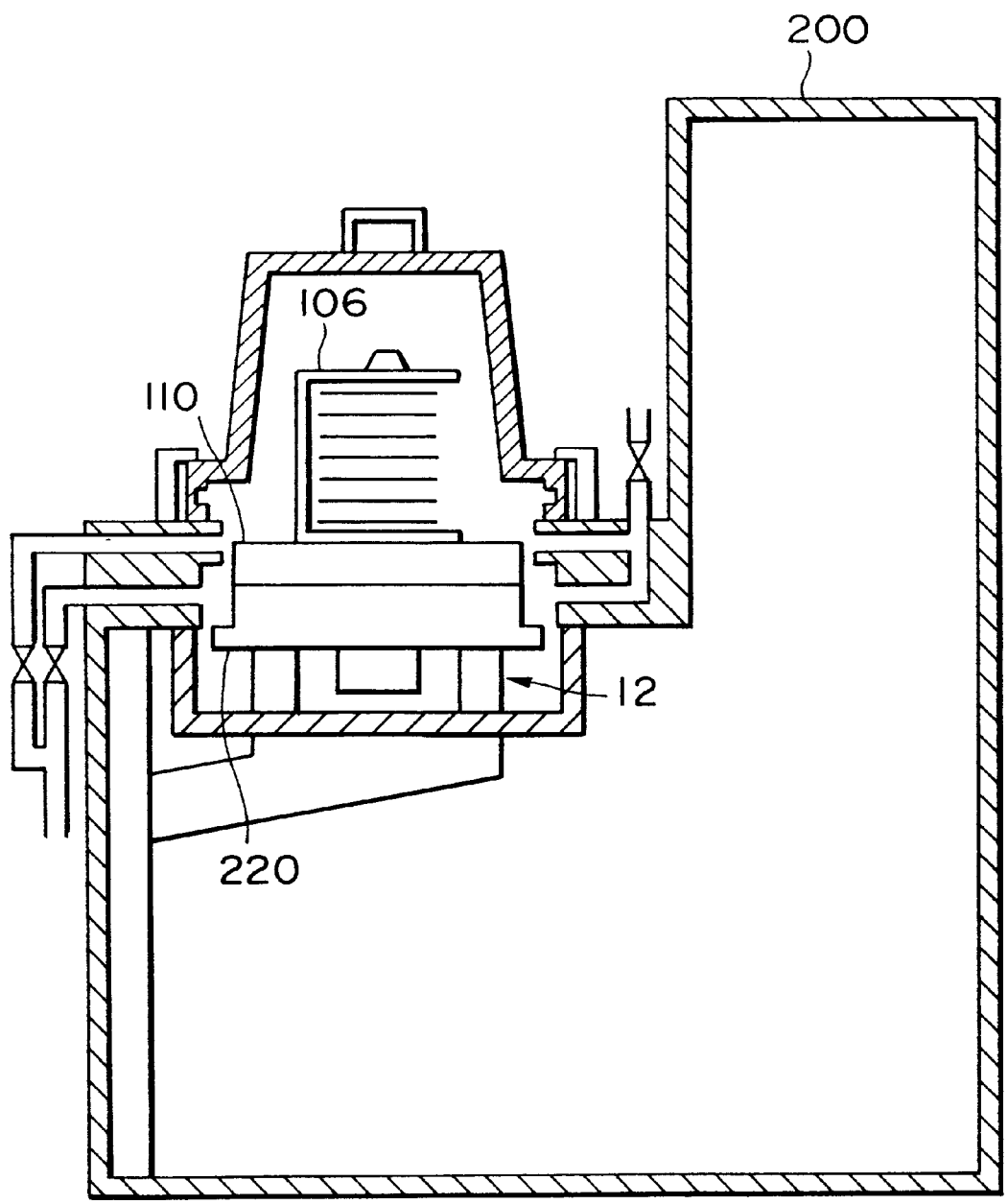
FIG. 13 is a diagram explaining the procedure for loading semiconductor wafers stored in a sealed container into a processing apparatus with the same mechanical interface apparatus.
Figure 14:
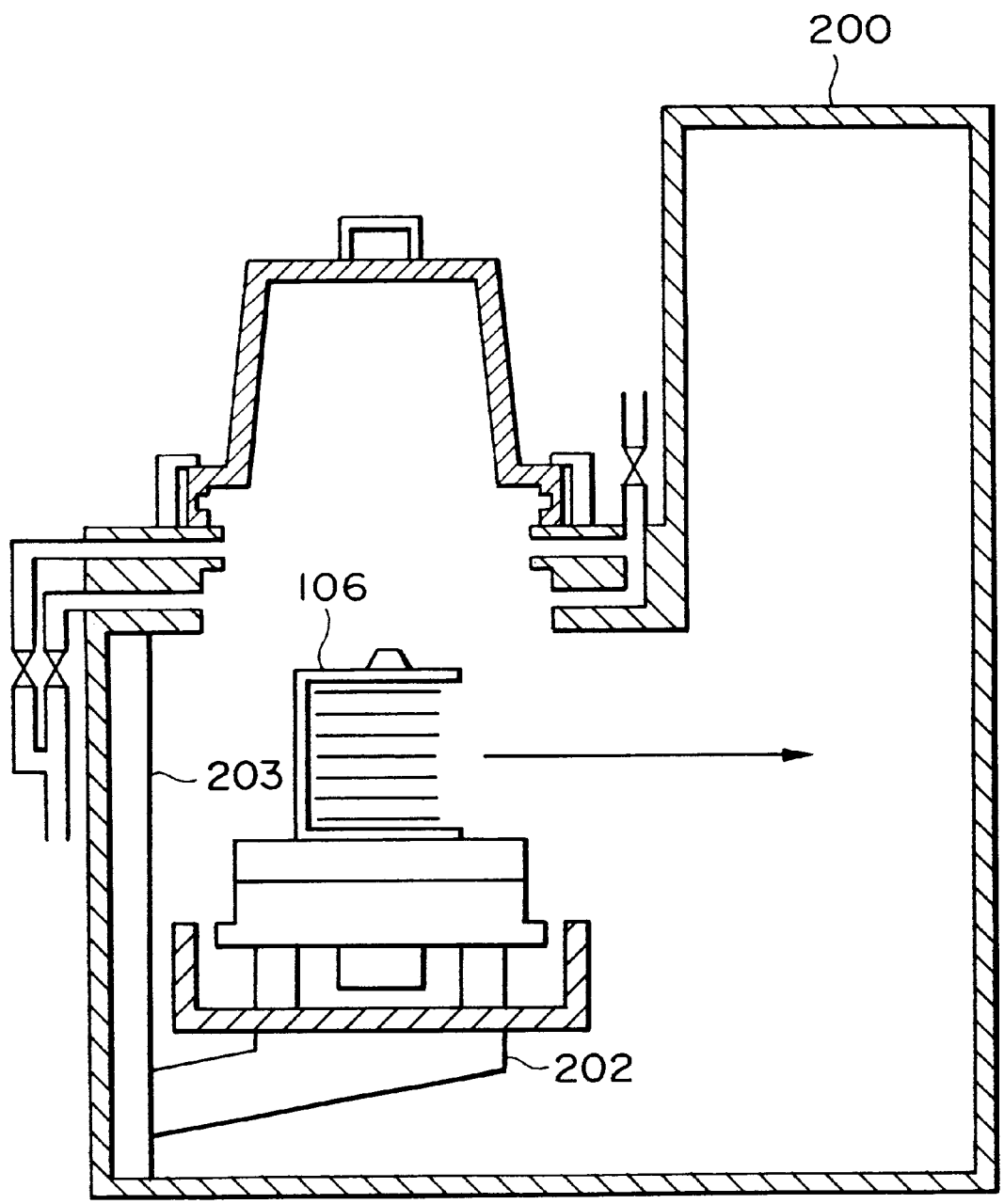
FIG. 14 is a diagram explaining the procedure for loading semiconductor wafers stored in a sealed container into a processing apparatus with the same mechanical interface apparatus.

When the bottom lid 110 is unlocked, the in-chamber elevator mechanism 12 is operated as shown in FIG. 13, so as to lower the wafer cassettes 106 along with the bottom lid 110 which is placed on the lock operating mechanism 220. Then, the in-apparatus elevator mechanism 202 is lowered along the rail 203 as shown in FIG. 14, and when it has been lowered to a predetermined position, the wafer cassettes 106 are loaded into the processing apparatus 200 b means of a cassette loading mechanism (not shown in the drawing) which is provided within the apparatus.

According to the above-described embodiment of the mechanical interface apparatus, the inert gas supplied from the inert gas tank is supplied to both the airtight chamber 11 and the space formed by the outer circumferential surface of the bottom lid 110, the inner surface of the flange 103 and the outer circumferential surface of the lock operating mechanism 220. Consequently, the amount of time required for the gas purge can be shortened so as to save on the amount of inert gas used for the gas purge.

FOURTH EMBODIMENT

Next, a mechanical interface apparatus according to a fourth embodiment will be explained with reference to FIGS. 15 through 18. First, the structure of the mechanical interface apparatus 30 according to the present embodiment will be explained with reference to FIG. 15.

Figure 15:
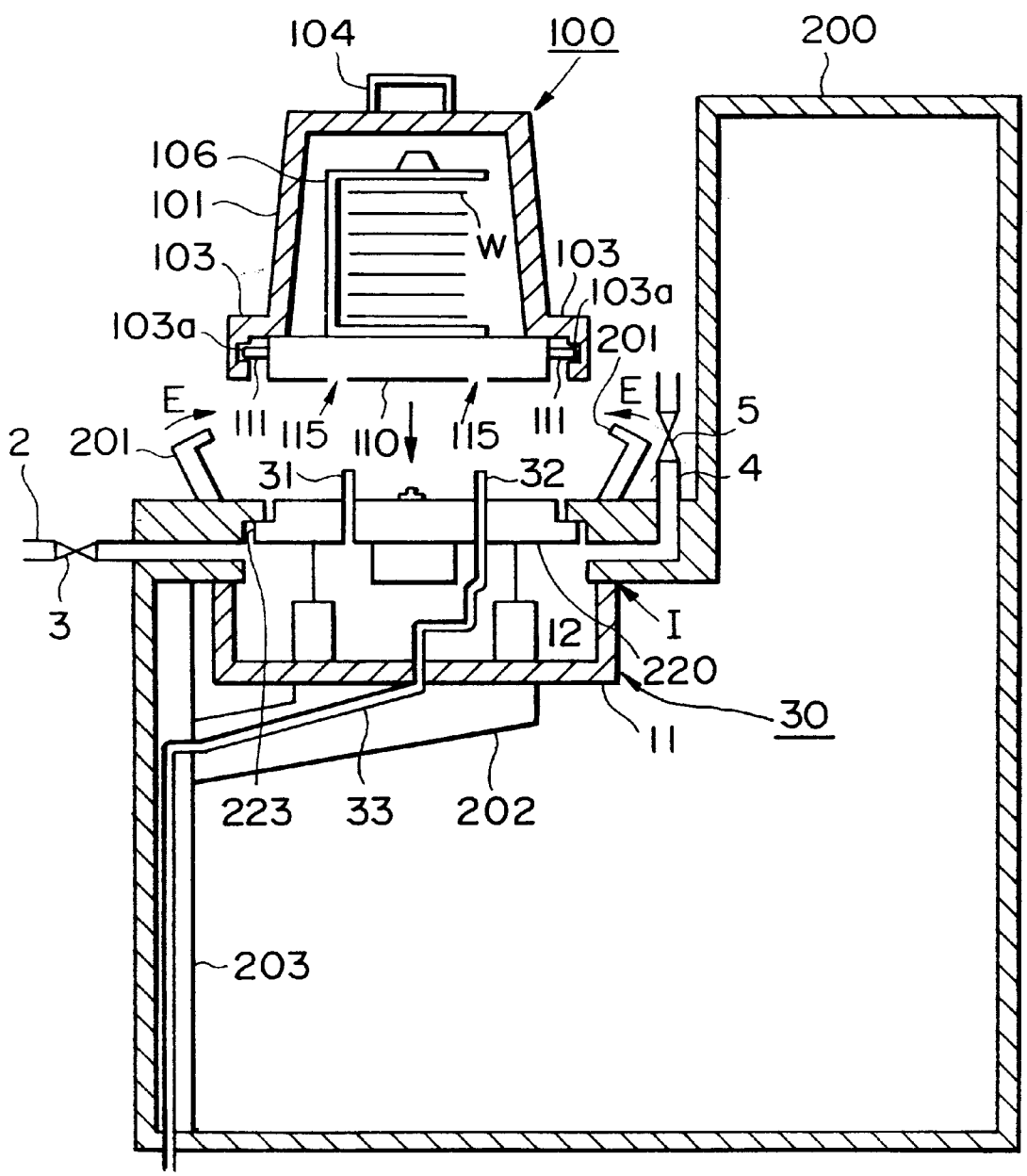
FIG. 15 is a diagram explaining the structure of a mechanical interface apparatus according to a fourth embodiment of the present invention and the procedure for loading semiconductor wafers stored in a sealed container into a processing apparatus.

In FIG. 15, the portions corresponding to portions shown in FIG. 5 are given the same reference numerals, and their explanations will be omitted. The mechanical interface apparatus 30 shown in FIG. 15 is different from that of FIG. 5 with regard to the following points.

Reference numerals 31 and 32 each denote pipe-shaped positioning guide valves having hollow interiors, of which one end passes through the interior of the lock operating mechanism 220 and opens into the airtight chamber 11, and the other end protrudes outside through the surface of the lock operating mechanism 220. Additionally, guide holes 115 are provided at positions respectively corresponding to the positions of attachment of the positioning guide valves 31 and 32 on the bottom surface of the bottom lid 110 of the sealed container 100. When the sealed container 100 is placed on the semiconductor wafer processing apparatus 30, the positioning guide valves 31 and 32 are inserted into their corresponding guide holes 115, thereby positioning the sealed containers 100 in the placement position.

A flexible tube 33 is connected to the end of the positioning guide valve 32 which opens into the airtight chamber 11, and this tube 33 communicates with the outside of the apparatus through the interior of the semiconductor wafer processing apparatus 30. Furthermore, the tips of the other ends of the positioning guide valves 31 and 32 protruding from the surface of the lock operating mechanism 220 have the structures shown in FIGS. 19A and 19B.

Figure 19A:
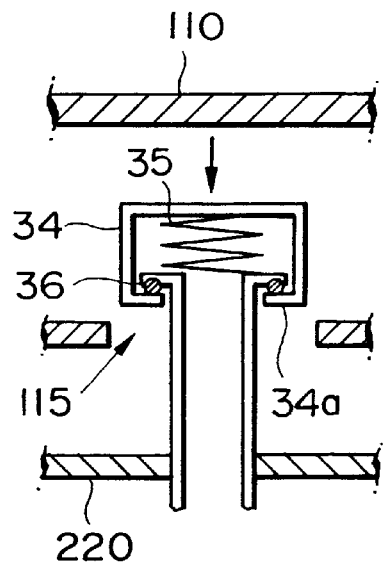
FIGS. 19A and 19B are diagrams explaining the procedure for loading semiconductor wafers stored in a sealed container into a processing apparatus with the same mechanical interface apparatus.
Figure 19B:
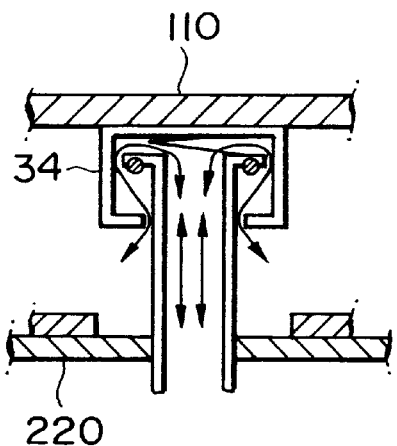

FIGS. 19A and 19B are section views showing the tips of the other ends of the positioning guide valves 31 and 32. In a normal state (see FIG. 19A), the spring 35 biases the valve 34 in an upward direction, so that the fold portion 34a of the valve 34 and the sealing material 36 are in tight contact, and the valve is in a closed state. When the sealed container 100 is placed on the lock operating mechanism 220, the valve 34 passes through the guide hole 115 provided on the bottom surface of the bottom lid 110 and contacts the inner top surface of the lock operating mechanism 220, as a result of which the valve 34 is pushed downward in opposition to the bias of the spring 35, and the valve is opened (see FIG. 19B).

Hereinbelow, the operations whereby the mechanical interface apparatus according to the present invention loads wafer cassettes 106 from the sealed container to the apparatus will be explained with reference to FIGS. 15 through 18.

First, as shown in FIG. 15, when a sealed container 100 is placed on top of a lock operating mechanism 220 of the semiconductor wafer processing apparatus 30 by means of a manipulator or the like, a cam (not shown in the drawing) inside the bottom lid 110 of the sealed container comes into spline engagement with the cam shaft 221, and the tips of the positioning guide valves 31 and 32 pass through the respective guide holes 115, until they contact the upper surface of the interior of the bottom lid 110 so that the pressing force causes the valves 33 of the positioning guide valves 31 and 32 to be opened. Additionally, when a sensor (not shown in the drawing) senses that the sealed container 100 has been placed on the lock operating mechanism 220, the latch mechanisms 201 move in the directions of the arrows E so as to engage with the flange 103 and affix the container body 101 to the top wall 200a.

Figure 16:
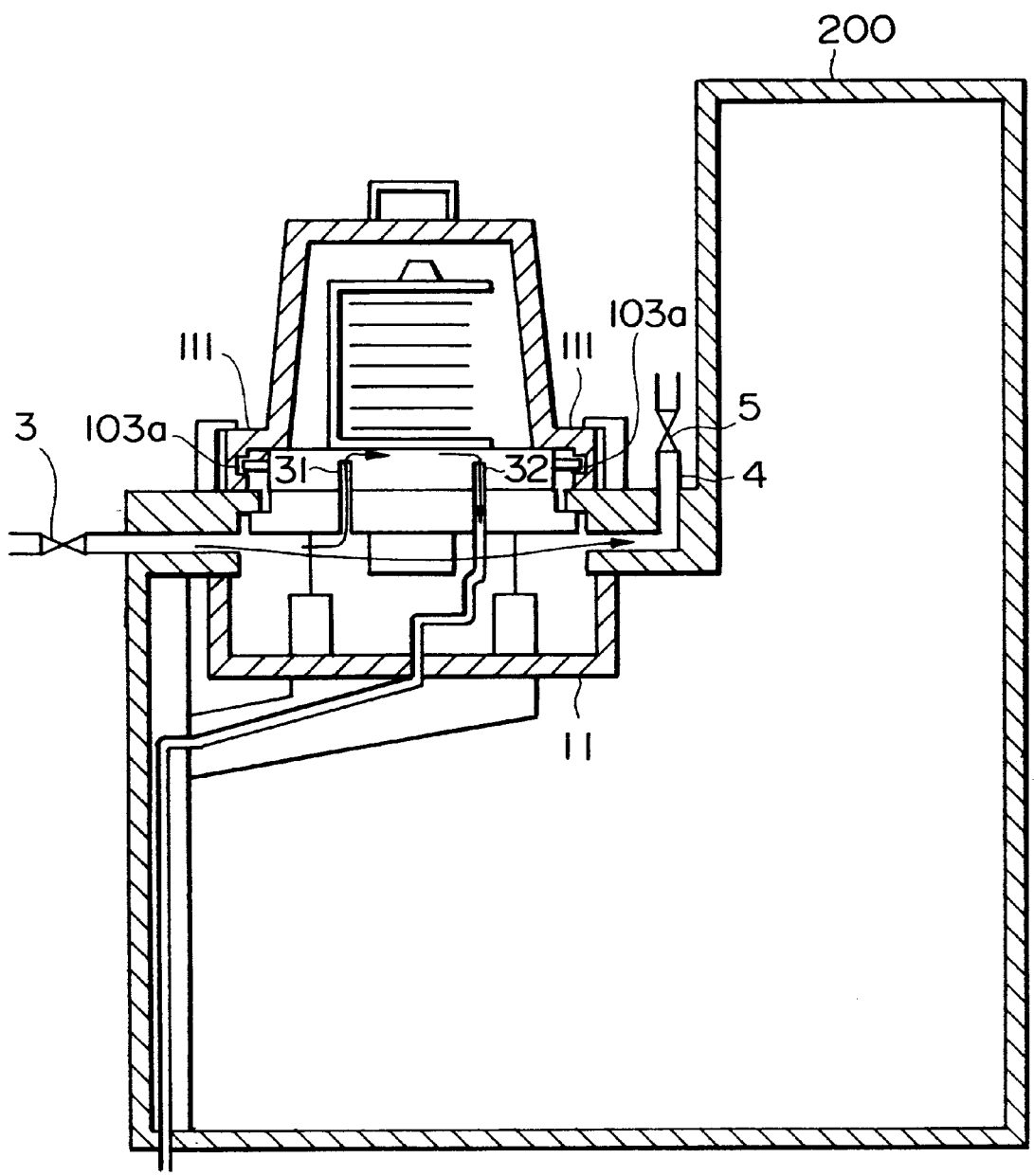
FIG. 16 is a diagram explaining the procedure for loading semiconductor wafers stored in a sealed container into a processing apparatus with the same mechanical interface apparatus.

Next, with reference to FIG. 16, the valve 3 and 5 are opened to perform a gas purge. As a result, inert gas supplied from an inert gas tank (not shown in the drawing) flows into the airtight chamber 11, the gas occupying the airtight chamber 11 is exhausted to the outside through the exhaust pipe 4 and the valve 5, to be replaced by a high concentration of inert gas. A portion of the inert gas flowing into the airtight chamber 11 flows through the positioning guide valves 31 and inside the bottom lid 11, while the gas occupying the bottom lid 110, together with dust penetrating to the inside, passes from the positioning guide valves 32 through the tube 33 to be exhausted outside of the processing apparatus 200.

After a gas purge has been performed for a predetermined period of time, the valves 3 and 5 are closed so as to stem the supply of inert gas and cut off the external air, then the drive mechanism provided inside the lock operating mechanism 220 is driven so as to rotate the cam shaft 221 counterclockwise through a predetermined angle in order to withdraw the lock arm 111 from the concave portion 103a.

Figure 17:
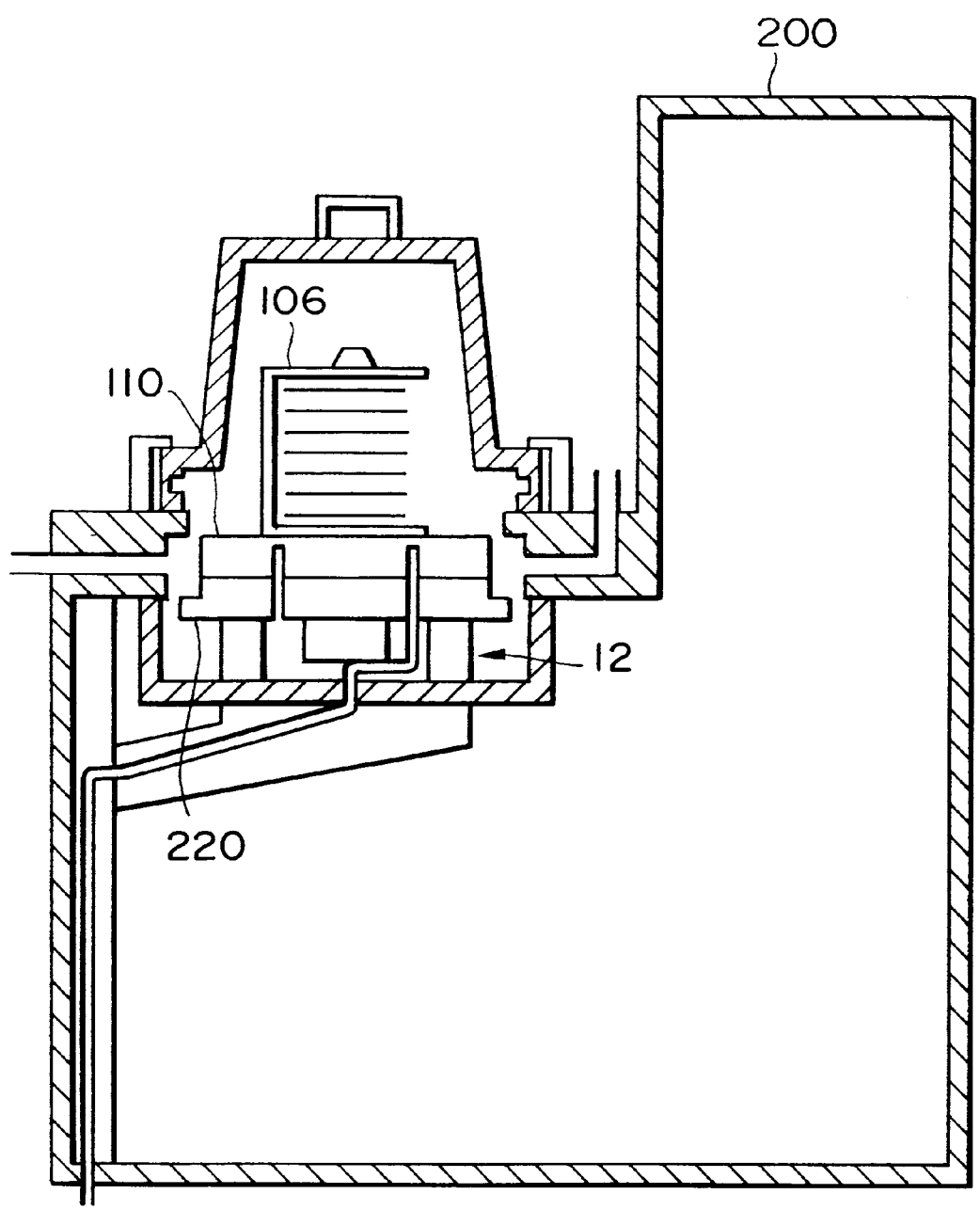
FIG. 17 is a diagram explaining the procedure for loading semiconductor wafers stored in a sealed container into a processing apparatus with the same mechanical interface apparatus.
Figure 18:
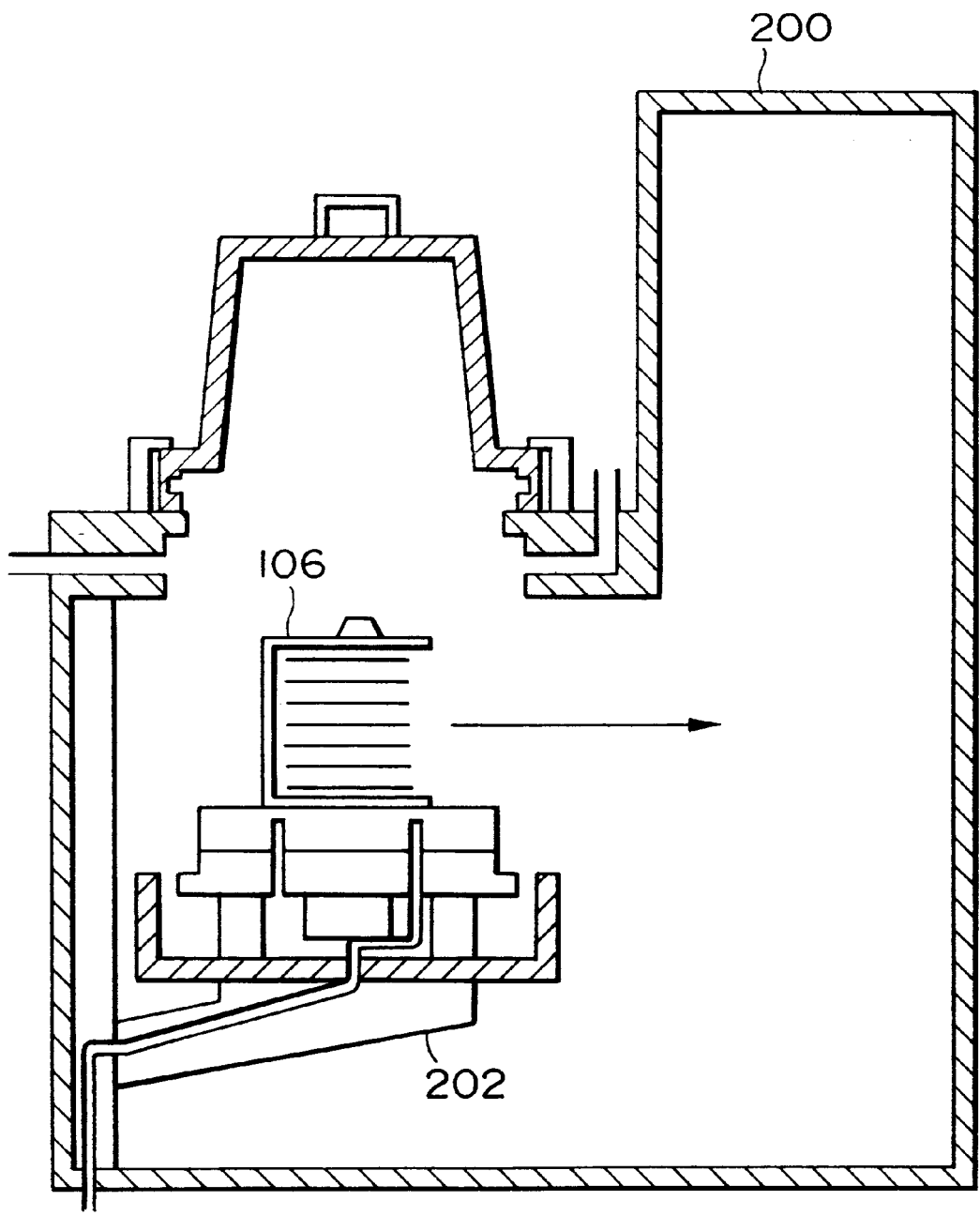
FIG. 18 is a diagram explaining the procedure for loading semiconductor wafers stored in a sealed container into a processing apparatus with the same mechanical interface apparatus.

Next, with reference to FIG. 17, when the bottom lid 110 has been unlocked, the in-chamber elevator mechanism 12 is operated so that the wafer cassettes 106 and the bottom lid 110 are lowered along with the lock operating mechanism 220. With reference to FIG. 18, after the in-apparatus elevator mechanism 202 has been lowered to a predetermined position along the rail 203, the wafer cassettes 106 are loaded into the processing apparatus 200 by means of a cassette loading mechanism (not shown in the drawings) provided in the apparatus.

With the mechanical interface apparatus according to the present embodiment, inert gas is supplied directly inside the bottom lid by means of the positioning guide valves, so that the gas purge can be completed in less time than is required in the case wherein the inert gas is supplied inside the bottom lid through the slight gaps formed between the lock arms 111 and the holes for passing the other ends of the lock arms from the interior of the bottom lid. As a result, the amount of inert gas used for the gas purge can be reduced.

FIFTH EMBODIMENT

In the present embodiment, the mechanical interface apparatus according to the above-described second through fourth embodiments are applied to a gas purge unit. In this case, a gas purge unit is an apparatus which, when the inert gas concentration inside a sealed container containing semiconductor wafers becomes lower than a standard value during transport standby or in storage, re-purges the gas in the sealed container so as to increase the inert gas concentration to above the standard value.

Hereinbelow, gas purge units using the mechanical interface apparatus of each of the above embodiments will be explained.

Figure 20A:
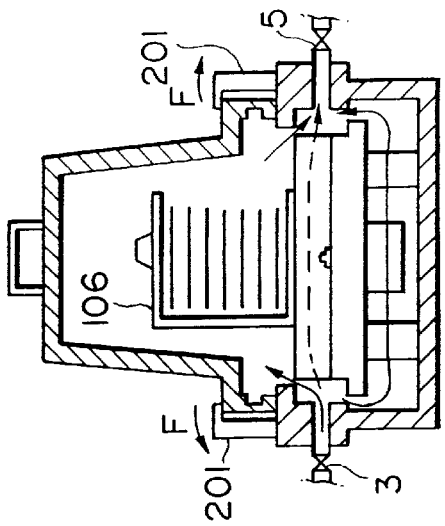
FIGS. 20A–20C are diagrams explaining the structure of a gas purge unit of the present invention and the gas purge procedure.
Figure 20B:
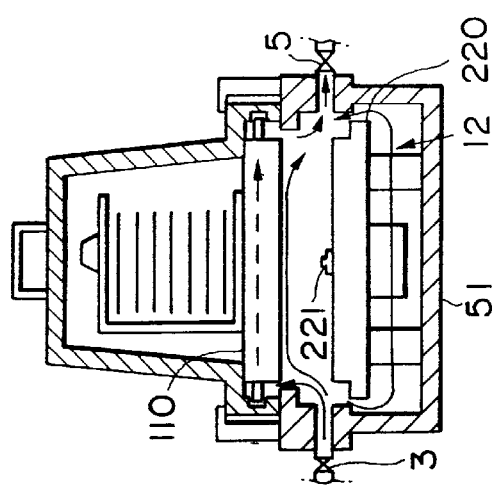
Figure 20C:
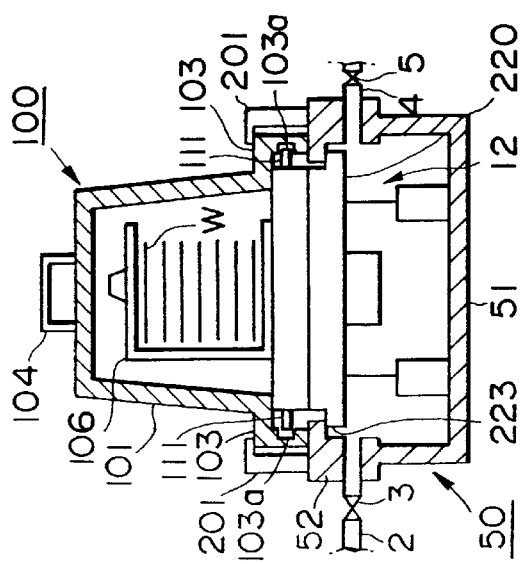

The gas purge unit 50 shown in FIGS. 20A–20C uses a portion of the mechanical interface apparatus of the second embodiment. In the drawing, the portions corresponding to the respective portions in FIG. 5 are given the same reference numerals, and their explanations will be omitted. The gas purge unit 50 is different from the mechanical interface apparatus 10 shown in FIG. 5 in that it has a purge box 51 instead of an airtight chamber 11. This purge box 51 is such that the inner surface of the purge box top wall 52 and the top surface of the flange 223 of the lock operating mechanism 220 come into tight contact when the in-chamber elevator mechanism 12 is at the highest position, thereby making the interior of the purge box 51 airtight.

Hereinbelow, the operations of the gas purge unit 50 will be explained with reference to FIGS. 20A–20C. First, with reference to FIG. 20A, when the sealed container 100 is placed on the gas purge unit 50 by means of a manipulator or the like, a cam (not shown in the drawing) inside the bottom lid 110 of the sealed container comes into spline engagement with the cam shaft 221. When a sensor (not shown in the drawing) senses this, the latch mechanisms 201 are activated to engage with the flange 103, in order to affix the container body 101.

Then, the in-chamber elevator mechanism 12 is lowered as shown in FIG. 20B, and the valves 3 and 5 are opened to allow inert gas from an inert gas tank (not shown in the drawing) to flow into the purge box 51 and the bottom lid 110, thereby replacing the atmosphere inside the purge box 51 with a high concentration of inert gas while simultaneously exhausting dust inside or on the bottom surface of the bottom lid and on the top surface of the lock operating mechanism 220 to the outside through the exhaust pipe 4 and the valve 5. After a predetermined period of time has passed, the valves 3 and 5 are closed. Then, the lock operating mechanism 220 is raised by the in-chamber elevator mechanism 12 so that the cam shaft 221 and the cam inside the bottom lid 110 come into spline engagement, upon which the drive mechanism (not shown in the drawing) inside the lock operating mechanism 220 is activated so as to rotate the cam shaft 221 counterclockwise over a predetermined angle to unlock the bottom lid 110.

Next, with reference to FIG. 20C, the in-chamber elevator mechanism 12 is lowered along with the lock operating mechanism 220, the bottom lid 110 and the wafer cassettes 106, and the valves 3 and 5 are re-opened to allow inert gas from an inert gas pump (not shown in the drawing) to flow into the sealed container 100, so that the gas inside the sealed container 100 is exhausted to the outside through the exhaust pipe 4 and the valve 5, and the interior atmosphere is replaced by a high concentration of inert gas. After a gas purge has been performed for a predetermined period of time, the valves 3 and 5 are opened and the in-chamber elevator mechanism 12 is raised to once again bring the cam shaft 221 and the cam inside the bottom lid 110 into spline engagement, upon which the drive mechanism inside the lock operating mechanism 220 is activated to rotate the cam shaft 221 clockwise over a predetermined angle in order to lock the bottom lid 110. Then, after the above operations have ended, the latch mechanisms 201 are moved in the directions of the arrows F in the drawing, thereby completing the gas purge of the sealed container.

Next, gas purge units using the mechanical interface apparatus 20 and 30 according to the third and fourth embodiments will be explained.

Figure 21A:
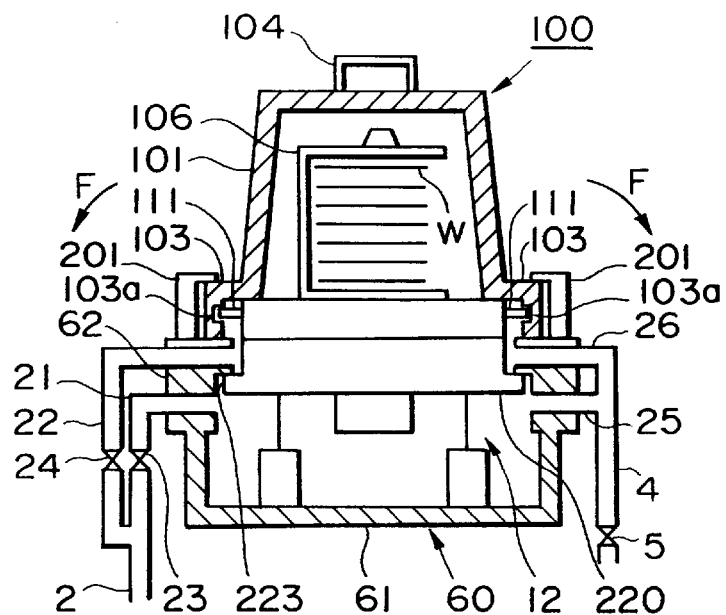
FIGS. 21A and 21B are diagrams explaining another structure for a gas purge unit according to the same embodiment.

The gas purge unit 60 of FIG. 21A uses a portion of the mechanical interface apparatus 20 of the third embodiment. In the drawing, the portions corresponding to respective portions shown in FIG. 11 are given the same reference numerals, and their explanations will be omitted.

The gas purge unit 60 is different from the apparatus shown in FIG. 11 in that it has a purge box 61 instead of an airtight chamber 11. When the in-chamber elevator mechanism 12 is at the highest position, the inner surface of the top wall 62 of the purge box and the top surface of the flange 223 of the lock operating mechanism come into tight contact, in which state the interior of the purge box 61 is made airtight.

Next, the operations of the gas purge unit 60 will be explained. First, when a sealed container 100 is placed on the gas purge unit 60 by means of a manipulator or the like, the cam (not shown in the drawing) inside the bottom lid 110 of the sealed container and the cam shaft 221 come into spline engagement. When a sensor (not shown in the drawing) senses this, the latch mechanisms 201 are activated to engage with the flange 103 and affix the container body 101.

Then, the valves 3 and 5 are opened to allow inert gas from an inert gas tank (not shown in the drawing) to flow into the purge box 51 and the bottom lid 110, while dust inside or on the bottom surface of the bottom lid 110 and on the top surface of the lock operating mechanism 220 is exhausted outside through the exhaust pipe 4 and the valve 5. After the passage of a predetermined period of time, the valves 3 and 5 are closed, and the lock operating mechanism 220 is raised by means of the in-chamber elevator mechanism 12 so as to bring the cam shaft 221 and the cam inside the bottom lid 110 into spline engagement, upon which the drive mechanism (not shown in the drawing) inside the lock operating mechanism 220 is activated in order to rotate the cam shaft 221 counterclockwise over a predetermined angle, thereby unlocking the bottom lid 110.

Next, the valves 23, 24 and 5 are opened to perform a gas purge. As a result, an inert gas supplied from an inert gas tank (not shown in the drawing), along with dust adhering inside or on the external air contact surfaces of the bottom lid 110, the external air contact surfaces of the lock operations mechanism 220 and inside the airtight chamber 11, passes through the branch exhaust pipes 25 and 26, the exhaust pipe 4 and the valve 5 to be exhausted to the outside of the gas purge unit 60.

Then, after the gas purge has been performed for a predetermined period of time, the valves 23, 24 and 5 are closed so as to stem the supply of inert gas and shut off the external air, then the drive mechanism provided inside the lock operating mechanism 220 is activated so as to rotate the cam shaft 221 counterclockwise over a predetermined angle and withdraw the lock arms 111 from the concave portions 103*a*. As a result, the bottom lid 110 is unlocked, upon which the in-chamber elevator mechanism 220 is lowered along with the lock operating mechanism 220, the bottom lid 110 and the wafer cassettes 106. Then, the valves 23, 24 and 5 are re-opened to allow inert gas from an inert gas tank (not shown in the drawing) to flow inside the sealed container 100, so that the gas inside the sealed container 100 passes through the exhaust pipe 4 and the valve 5 to be exhausted to the outside while the interior atmosphere is replaced with a high concentration of inert gas.

After the passage of a predetermined period of time, the valves 23, 24 and 5 are closed. Then, the in-chamber elevator mechanism 12 is raised to bring the cam shaft 221 and the cam inside the bottom lid 110 into spline engagement once again, and the drive mechanism inside the lock operating mechanism is activated so as to rotate the cam shaft 221 clockwise over a predetermined angle, thereby locking the bottom lid 110. After the above operations have ended, the latch mechanisms 201 are moved in the directions of the arrows F to complete the gas purge of the sealed container.

Figure 21B:
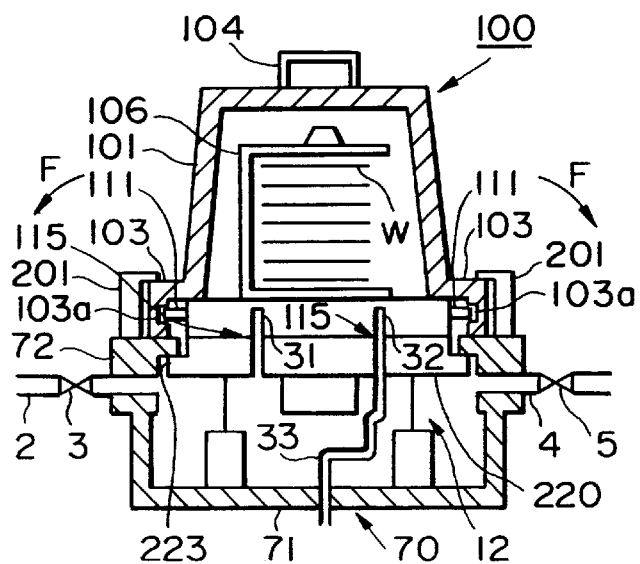
Figure 22:
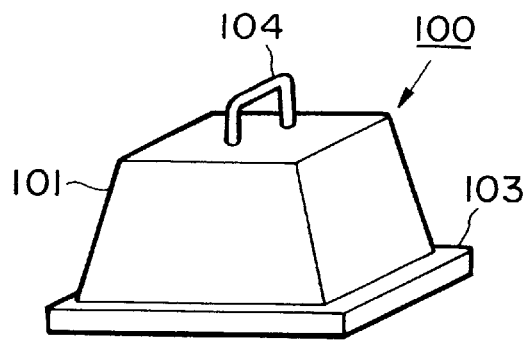
FIG. 22 is an outer perspective view showing the outer view of a conventional sealed container.
Figure 23:
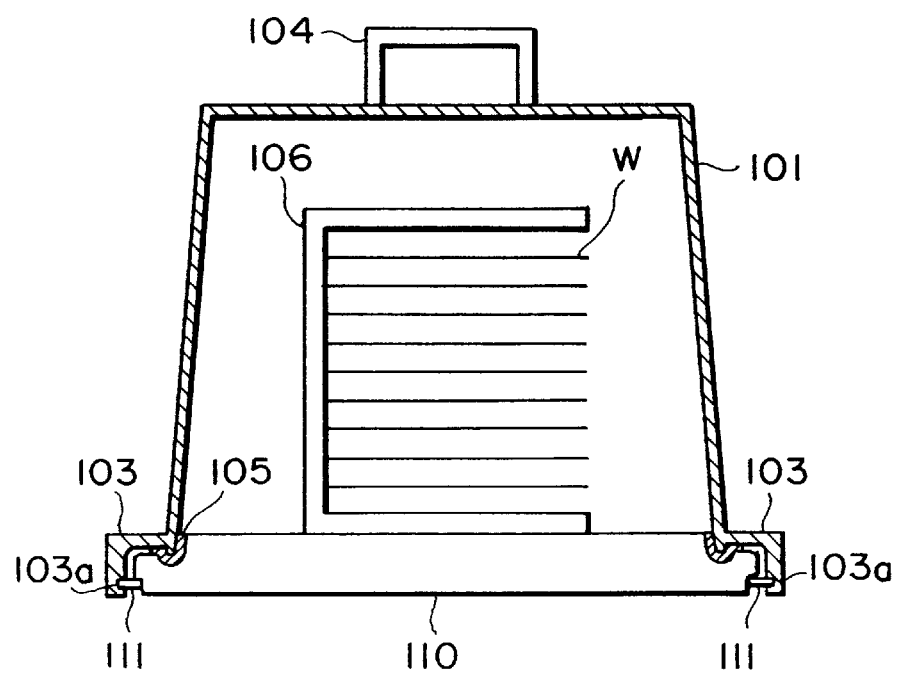
FIG. 23 is a section view showing a cross-section of the same sealed container, with the content of the container in a state of storage.
Figure 24:
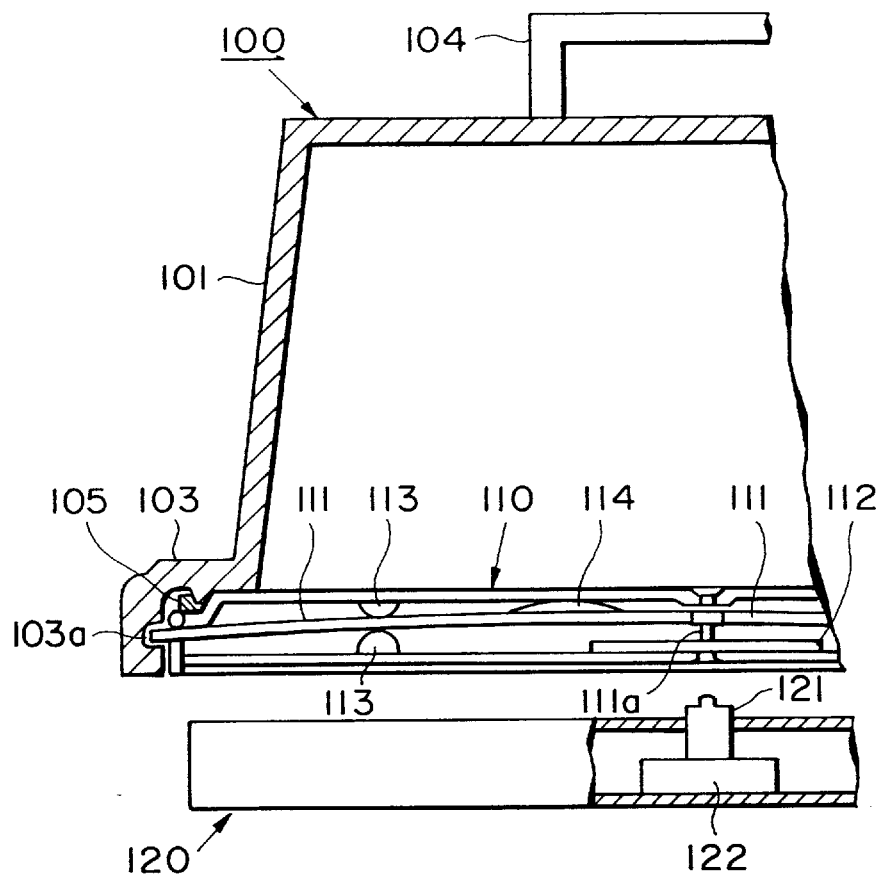
FIG. 24 is a diagram explaining the structure of the interior of the bottom lid of the same sealed container.
Figure 25:
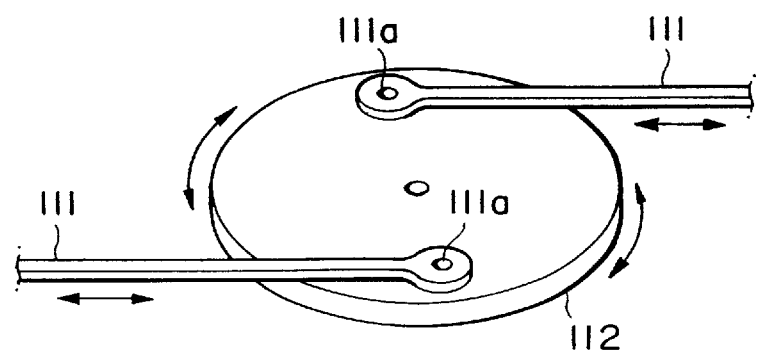
FIG. 25 is a diagram explaining a part of the structure of a locking/unlocking mechanism provided inside the same bottom lid.

The gas purge unit 70 of FIG. 21B uses a portion of the mechanical interface apparatus 30 according to the fourth embodiment. In this drawing, the portions corresponding to the respective portions in FIG. 15 are given the same reference numerals, and their explanations will be omitted.

The gas purge unit 70 is different from the mechanical interface apparatus of the semiconductor wafer processing apparatus 20 shown in FIG. 15 in that it has a purge box 71 instead of an airtight chamber 11. When the in-chamber elevator mechanism 12 is at its highest position, the inner surface of the top wall 72 of the purge box comes into tight contact with the top surface of the flange 223 of the lock operating mechanism 220, in which state the interior of the purge box 71 is made airtight.

Next, the operations of the gas purge unit 70 will be explained. First, a sealed container 100 is placed on the gas purge unit 70 by means of a manipulator or the like, then the cam 112 (not shown in the drawing) inside the bottom lid 110 of the sealed container and the cam shaft 221 come into spline engagement, the tips of the positioning guide valves 31 and 32 are passed through their respective guide holes 115 and come into contact with the top inner surface of the bottom lid 110, and their pressing force causes the valves 33 of the positioning guide valves 31 and 32 to open. When a sensor (not shown in the drawing) senses that the sealed container 100 has been placed on the lock operating mechanism 220, the latch mechanisms 201 are operated to engage them with the flange 103, thereby affixing the container body 101 on top of the gas purge unit 70.

Next, the valves 3 and 5 are opened to perform a gas purge. As a result, inert gas supplied from an inert gas tank (not shown in the drawing) flows into the purge box 71, and the gas inside the purge box 71 is exhausted to the outside through the exhaust pipe 4 and the valve 5. A portion of the inert gas flowing into the purge box 71 flows into the bottom lid 110 through the positioning guide valves 31, and the gas inside the bottom lid 110, along with dust penetrating into the interior, passes through the positioning guide valve 32 and the valve 33 to be exhausted to the outside through the gas purge unit 70.

After a gas purge has been performed for a predetermined period of time, the valves 3 and 5 are closed to stem the supply of inert gas and cut off the external air, then the drive mechanism provided in the lock operating mechanism 220 is activated in order to rotate the cam shaft 221 counterclockwise over a predetermined angle, thereby withdrawing the lock arms 111 from the concave portions 103a. When this unlocks the bottom lid 110, the in-chamber elevator mechanism 12 is operated to lower the lock operating mechanism 220 along with the bottom lid 110 and the wafer cassettes 106. Next, the valves 3 and 5 are re-opened to allow inert gas from an inert gas tank (not shown in the drawing) to flow into the sealed container 100, so that the gas inside the sealed container 100 passes through the exhaust pipe 4 and the valve 5 to be exhausted to the outside, and the internal atmosphere is replaced with a high concentration of inert gas.

After the passage of a predetermined period of time, the valves 3 and 5 are closed, then the in-chamber elevator mechanism 12 is raised so that the cam shaft 221 and the cam inside the bottom lid 110 are once again brought into spline engagement, and the drive mechanism inside the lock operating mechanism 220 is activated so that the cam shaft 221 is rotated clockwise over a predetermined angle, thereby locking the bottom lid 110. After the above operations have ended, the latch mechanisms 201 are moved in the directions of the arrows F so as to complete the gas purge of the sealed container.

According to the various types of gas purge units described above, dust adhering to the bottom lid of the sealed container during transport of the sealed container is once removed before the gas purge is performed, so that dust will not penetrate into the sealed container, and the interior of the sealed container can be kept in clean condition.

What is claimed is:

1. A mechanical interface apparatus, for a processing apparatus that is to be supplied with contents in a sealed container formed of a container body, a lid on which the contents are held within the container and which is to seal a mouth portion of said container body in an airtight manner, and a lock mechanism for locking and unlocking said lid by means of external operation for loading said contents into said processing apparatus without exposure to external air, comprising:

first elevator means for moving up and down within said processing apparatus;

box-shaped seal maintenance means having a hollow interior and an aperture provided on said first elevator means such that an aperture edge portion of said seal maintenance means contacts an inner surface of said processing apparatus in the periphery of a mouth portion of said processing apparatus when said first elevator means is at its maximum elevation for loading said contents to maintain airtightness of said processing apparatus;

second elevator means provided within said seal maintenance means;

sealing means on said second elevator means including a lid opening/closing mechanism for operating said lock mechanism for sealing said mouth portion of said processing apparatus from inside said processing apparatus when said second elevator means is at a maximum elevation and said first elevator means is at its maximum elevation;

gas supply means for supplying gas to a space formed by the bottom of the lid of said sealed container, said seal maintenance means and said processing apparatus when said sealed container is placed on the processing apparatus over said mouth portion when said second elevator means is lowered; and gas exhaust means for exhausting gas from said space to an outside portion; wherein with the lock mechanism locked, said first elevator means is at its maximum elevation, and said second elevator means is lowered, gas purging of said space is carried out by the gas supply means and the gas exhaust means.

* * * * *